US009842966B2

(12) United States Patent
Cha et al.

(10) Patent No.: US 9,842,966 B2
(45) Date of Patent: *Dec. 12, 2017

(54) NANO-STRUCTURED SEMICONDUCTOR LIGHT-EMITTING ELEMENT

(71) Applicant: SAMSUNG ELECTRONICS CO., LTD., Suwon-si (KR)

(72) Inventors: Nam-Goo Cha, Hwaseong-si (KR); Bong-Jin Kuh, Suwon-si (KR); Han-Mei Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/764,513

(22) PCT Filed: Jan. 28, 2014

(86) PCT No.: PCT/KR2014/000813
§ 371 (c)(1),
(2) Date: Jul. 29, 2015

(87) PCT Pub. No.: WO2014/119911
PCT Pub. Date: Aug. 7, 2014

(65) Prior Publication Data
US 2015/0372194 A1 Dec. 24, 2015

(30) Foreign Application Priority Data
Jan. 29, 2013 (KR) .................. 10-2013-0010111
Dec. 26, 2013 (KR) .................. 10-2013-0164522

(51) Int. Cl.
*H01L 33/24* (2010.01)
*H01L 33/20* (2010.01)
(Continued)

(52) U.S. Cl.
CPC ............ *H01L 33/24* (2013.01); *H01L 33/005* (2013.01); *H01L 33/08* (2013.01); *H01L 33/18* (2013.01); *H01L 33/20* (2013.01); *B82Y 20/00* (2013.01)

(58) Field of Classification Search
None
See application file for complete search history.

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

CN   101443887 A   5/2009
CN   102403428 A   4/2012
(Continued)

OTHER PUBLICATIONS

Office Action dated Sep. 18, 2015, issued by the United States Patent and Trademark Office in U.S. Appl. No. 14/165,082.
(Continued)

*Primary Examiner* — William Coleman
*Assistant Examiner* — Kien Ly
(74) *Attorney, Agent, or Firm* — Sughrue Mion, PLLC

(57) ABSTRACT

There is provided a nanostructure semiconductor light emitting device including a base layer formed of a first conductivity-type semiconductor, a first insulating layer disposed on the base layer and having a plurality of first openings exposing partial regions of the base layer, a plurality of nanocores disposed in the exposed regions of the base layer and formed of the first conductivity-type semiconductor, an active layer disposed on surfaces of the plurality of nanocores positioned to be higher than the first insulating layer, a second insulating layer disposed on the first insulating
(Continued)

layer and having a plurality of second openings surrounding the plurality of nanocores and the active layer disposed on the surfaces of the plurality of nanocores, and a second conductivity-type semiconductor layer disposed on the surface of the active layer positioned to be higher than the second insulating layer.

14 Claims, 19 Drawing Sheets

(51) Int. Cl.
    *H01L 33/18*     (2010.01)
    *H01L 33/08*     (2010.01)
    *H01L 33/00*     (2010.01)
    *B82Y 20/00*     (2011.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,427,772 B2 | 9/2008 | Chuo et al. | |
| 7,501,656 B2 | 3/2009 | Han et al. | |
| 7,588,955 B2 | 9/2009 | Huang et al. | |
| 7,709,857 B2 | 5/2010 | Kim et al. | |
| 7,759,140 B2 | 7/2010 | Lee et al. | |
| 7,763,881 B2 | 7/2010 | Lee et al. | |
| 7,781,727 B2 | 8/2010 | Sherrer et al. | |
| 7,790,482 B2 | 9/2010 | Han et al. | |
| 7,888,694 B2 | 2/2011 | Lee et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,036,673 B2 * | 5/2015 | Kawaguchi | H01S 5/18341 |
| | | | 372/45.012 |
| 9,196,787 B2 * | 11/2015 | Svensson | H01L 33/06 |
| 2004/0048409 A1 * | 3/2004 | Biwa | H01L 33/24 |
| | | | 438/46 |
| 2004/0051110 A1 * | 3/2004 | Oohata | H01L 33/38 |
| | | | 257/89 |
| 2005/0023543 A1 * | 2/2005 | Konno | H01L 33/08 |
| | | | 257/94 |
| 2005/0145865 A1 * | 7/2005 | Okuyama | H01L 33/007 |
| | | | 257/98 |
| 2006/0051939 A1 * | 3/2006 | Kuramoto | H01L 33/0075 |
| | | | 438/478 |
| 2007/0235738 A1 | 10/2007 | Jin et al. | |
| 2008/0149944 A1 | 6/2008 | Samuelson et al. | |
| 2009/0020772 A1 | 1/2009 | Chiu et al. | |
| 2010/0078688 A1 | 4/2010 | Otake et al. | |
| 2010/0276664 A1 * | 11/2010 | Hersee | B82Y 20/00 |
| | | | 257/15 |
| 2011/0095314 A1 * | 4/2011 | Pan | H01L 33/58 |
| | | | 257/98 |
| 2011/0114915 A1 | 5/2011 | Lee et al. | |
| 2011/0126891 A1 * | 6/2011 | Goto | B82Y 20/00 |
| | | | 136/255 |
| 2011/0140072 A1 * | 6/2011 | Varangis | B82Y 20/00 |
| | | | 257/9 |
| 2011/0272014 A1 * | 11/2011 | Mathai | H01L 31/035281 |
| | | | 136/255 |
| 2012/0001153 A1 | 1/2012 | Hersee et al. | |
| 2012/0061641 A1 | 3/2012 | Seong et al. | |
| 2012/0153252 A1 | 6/2012 | Kim et al. | |
| 2012/0205692 A1 | 8/2012 | Tan et al. | |
| 2012/0273755 A1 | 11/2012 | Wei et al. | |
| 2012/0315760 A1 | 12/2012 | Yu et al. | |
| 2013/0099199 A1 * | 4/2013 | Cha | H01L 33/385 |
| | | | 257/13 |
| 2014/0138620 A1 * | 5/2014 | Svensson | H01L 33/007 |
| | | | 257/13 |
| 2014/0209858 A1 * | 7/2014 | Cha | H01L 33/20 |
| | | | 257/13 |

FOREIGN PATENT DOCUMENTS

| | | |
|---|---|---|
| JP | 2009-27128 A | 2/2009 |
| JP | 2012-235122 A | 11/2012 |
| KR | 10-2010-0133157 A | 12/2010 |
| KR | 10-2011-0054318 A | 5/2011 |
| KR | 10-2011-0058388 A | 6/2011 |
| KR | 10-2012-0013076 A | 2/2012 |
| KR | 10-2012-0040550 A | 4/2012 |
| KR | 10-2012-0052651 A | 5/2012 |
| KR | 10-2012-0055391 A | 5/2012 |
| KR | 10-2012-0058137 A | 6/2012 |
| KR | 10-1176885 B1 | 8/2012 |
| KR | 10-2013-0025716 A | 3/2013 |
| KR | 10-1258583 B1 | 5/2013 |
| KR | 10-2014-0096979 A | 8/2014 |
| WO | 2008/048704 A2 | 4/2008 |

OTHER PUBLICATIONS

Anonymous, "Surround" Roget's 21st Century Thesaurus, 3rd Edition, 2013, /www.thesaurus.com/browse/surrond?s=t;2016, 3 pages total.

Office Action dated Jan. 15, 2016, issued by the United States Patent and Trademark Office in U.S. Appl. No. 14/165,082.

Communication dated Mar. 3, 2017, issued by the State Intellectual Property Office of P.R. China in counterpart Chinese Application No. 201480015106.7.

Jin-min Lee "A Researching about Reducing Leakage Current of Polycrystalline Silicon Thin Film Transistors with Bird's Beak Structure", vol. 24, No. 2, pp. 112-115, Feb. 2011.

Seung-Hyun Song et al., "Simulation of nonoverlapped source/drain-to-gate Nano-CMOS for low leakage current", vol. 29, No. 1, pp. 579-580, 2006.

Int. Search Report dated May 16, 2014 issued in Int. Application No. PCT/KR2014/000813 (PCT/ISA/210).

* cited by examiner

NANO-STRUCTURED SEMICONDUCTOR LIGHT-EMITTING ELEMENT

TECHNICAL FIELD

The present disclosure relates to a nanostructure semiconductor light emitting device.

BACKGROUND ART

A light emitting diode (LED) is a semiconductor light emitting device in which materials included therein emit light. In an LED, energy generated according to electron-hole recombination is converted into light to be emitted therefrom. LEDs are commonly used as a light source in lighting devices and display devices, and as such, the development thereof has tended to be accelerated.

Recently, in order to increase luminance efficiency by enhancing crystallinity and increasing a light emitting area, semiconductor light emitting devices using nanostructures and manufacturing techniques thereof have been developed. Semiconductor light emitting devices using nanostructures generate a relatively small amount of heat, and since an increased surface area of nanostructures is used, a light emitting area is increased to enhance luminous efficiency may be enhanced.

In case of a nanostructure semiconductor light emitting device, a light emitting structure is formed as a fine structure on the nano-scale, layers are formed to be very thin and delamination, or the like, may occur in an interface between a layer and a mask as an insulating layer. Thus, a leakage current may be generated when the device is driven.

DISCLOSURE

Technical Problem

An aspect of the present disclosure provides a nanostructure semiconductor light emitting device having a novel structure capable of reducing a leakage current.

Technical Solution

According to an aspect of the present disclosure, there is provided a nanostructure semiconductor light emitting device including: a base layer formed of a first conductivity-type semiconductor; a first insulating layer disposed on the base layer and having a plurality of first openings exposing partial regions of the base layer; a plurality of nanocores disposed in the exposed regions of the base layer and formed of the first conductivity-type semiconductor; an active layer disposed on surfaces of the plurality of nanocores positioned to be higher than the first insulating layer; a second insulating layer disposed on the first insulating layer and having a plurality of second openings surrounding the plurality of nanocores and the active layer disposed on the surfaces of the plurality of nanocores; and a second conductivity-type semiconductor layer disposed on the surface of the active layer positioned to be higher than the second insulating layer.

The active layer may be disposed on inner side walls of the second openings.

The second openings may have a diameter greater than that of the first openings, and a portion of the first insulating layer in the perimeter of the first openings may be exposed by the second openings.

Regions of the nanocores positioned in the second openings may have a sectional area greater than upper and lower regions thereof.

The inner side walls of the second openings may have an upwardly sloped surface, and an end of the active layer may be positioned on the sloped surface.

The first and second insulating layers may be formed of the same material. The first and second insulating layers may have different etching rates under the same etching conditions. An etching rate of the second insulating layer may be higher than that of the first insulating layer. In order to induce the difference in etching rates, the first and second insulating layers may be formed of different materials or may be disposed to have different air gap densities.

The second insulating layer may be formed of a material obtained by oxidizing a material of the first insulating layer.

According to another aspect of the present disclosure, there is provided a nanostructure semiconductor light emitting device including: a base layer formed of a first conductivity-type semiconductor; a first insulating layer disposed on the base layer and having a plurality of first openings exposing partial regions of the base layer; a plurality of nanocores disposed in the exposed regions of the base layer and formed of the first conductivity-type semiconductor; an active layer and a second conductivity-type semiconductor layer sequentially disposed on surfaces of the plurality of nanocores positioned to be higher than the first insulating layer; a second insulating layer disposed on the first insulating layer and having a plurality of second openings surrounding the plurality of nanocores and the active layer and the second conductivity-type semiconductor layer sequentially disposed on the surfaces of the plurality of nanocores; and an electrode positioned to be higher than the second insulating layer and connected to the second conductivity-type semiconductor layer.

The first and second insulating layers may have different etching rates under the same etching conditions. An etching rate of the second insulating layer may be higher than that of the first insulating layer. In order to induce the difference in etching rates, the first and second insulating layers may be formed of different materials or may be disposed to have different air gap densities.

The second insulating layer may be formed of a material obtained by oxidizing a material of the first insulating layer.

Effect of Invention

According to embodiments of the invention, since a path causing a leakage current in the interface with the mask is lengthened using the active layer or the first conductivity-type semiconductor layer corresponding to a shell, a generation of a leakage current may be considerably suppressed.

The structure of lengthening the leakage current path may be more easily realized using a multi-layer mask utilized as a mold through selectivity and an etching process.

The above and other aspects, features and other advantages of the present disclosure will be more clearly understood from the following detailed description taken in conjunction with the following embodiments.

DETAILED DESCRIPTION OF THE PREFERRED EMBODIMENT

Figure 1:
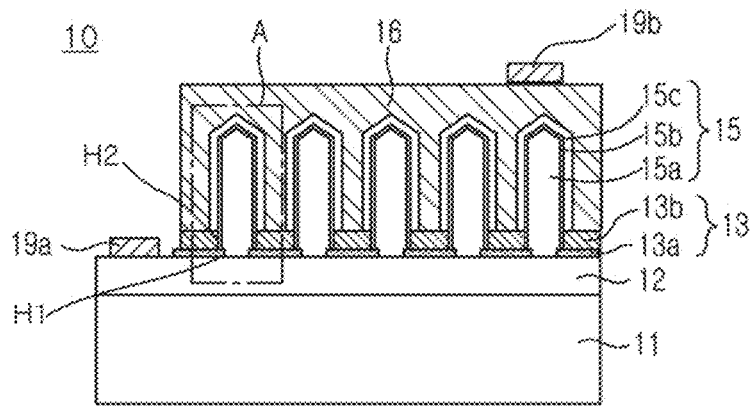
FIG. 1 is a cross-sectional view illustrating a nanostructure semiconductor light emitting device according to an exemplary embodiment of the present inventive concept.

Embodiments of the present disclosure will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a cross-sectional view of a nanostructure semiconductor light emitting device according to an exemplary embodiment of the present inventive concept.

As illustrated in FIG. 1, a nanostructure semiconductor light emitting device 10 according to the present embodiment includes a base layer 12 formed of a first conductivity-type semiconductor and a plurality of light emitting nanostructures 15 formed on an upper surface thereof.

The plurality of light emitting nanostructures 15 include a nanocore 15a formed of the first conductivity-type semiconductor and an active layer 15b and a second conductivity-type semiconductor layer 15c sequentially formed on a surface of the nanocore 15a, respectively.

A contact electrode 16 is formed on the light emitting nanostructure 15 and connected to the second conductivity-type semiconductor layer 15c. The nanostructure semiconductor light emitting device 10 includes first and second electrodes 19a and 19b connected to the base layer 12 and the contact electrode 16, respectively.

The base layer 12 is formed on a substrate 11 to provide a growth surface for the light emitting nanostructure 15, and serves to electrically connect common polarities of the plurality of light emitting nanostructures 151 on one side thereof.

The substrate 11 may be an insulating, conductive, or semiconductor substrate. For example, the substrate 11 may be formed of sapphire, SiC, Si, $MgAl_2O_4$, MgO, $LiAlO_2$, $LiGaO_2$, or GaN. The base layer 12 may be a nitride semiconductor satisfying an empirical formula $Al_xIn_yGa_{1-x-y}N$, where $0 \leq x<1$, $0 \leq y<1$, and $0 \leq x+y<1$, and may be doped with n-type impurity such as silicon (Si) to have a particular conductivity-type.

A first insulating layer 13a may be formed on the base layer 12. The first insulating layer 13a may have a plurality of first openings H1 through which partial regions of the base layer 12 are exposed. A second insulating layer 13b is formed on the first insulating layer 13a. The second insulating layer 13b includes second openings H2 arranged in positions corresponding to the first openings H1. In this manner, the first and second insulating layers 13a and 13b may be provided as a single mask. The first and second insulating layers 13a and 13b may be provided as a single mask 13. As the first and second insulating layers 13a and 13b, an insulator that may be used in a semiconductor process may be used. For example, the insulator may be an insulating material such as $SiO_2$ or $SiN_x$.

The exposed region of the base layer 12 is provided by the first opening H1, and the plurality of nanocores 15a formed of the first conductivity-type semiconductor are formed in the exposed region. The active layer 15b and the second conductivity-type semiconductor layer 15c are sequentially formed as shells on the surface of the nanocore 15a.

In the present embodiment, the nanocore 15a is formed, starting from the surface of the base layer 12, but the active layer 15b is formed in a position higher than the first insulating layer 13a. The second insulating layer 13b surrounds the active layer 15b formed on the surface of the plurality of nanocores 15a, and the second opening H2 of the second insulating layer 13b may be formed along the outer circumference of the active layer 15b. Also, the second conductivity-type semiconductor layer 15c may be formed in a position higher than the second insulating layer 13b.

Figure 2:
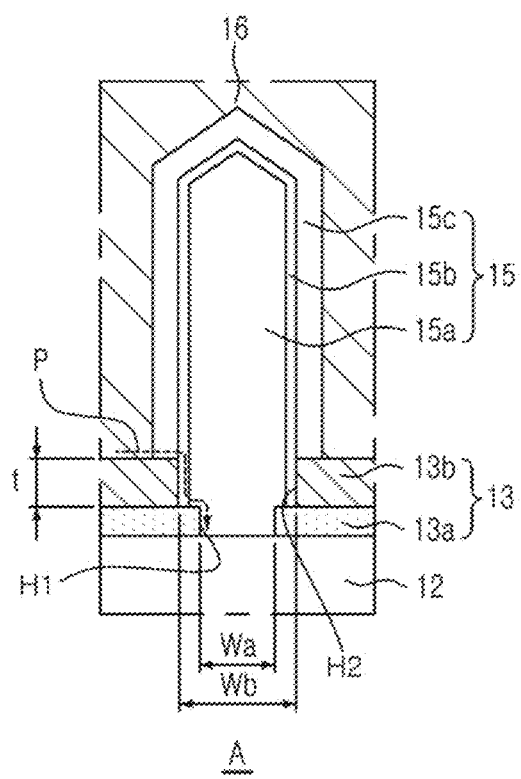
FIG. 2 is a cross-sectional view illustrating an enlarged portion 'A' in a light emitting nanostructure of the light emitting device illustrated in FIG. 1.

A formation position of the shells and a change in a leakage current path will be described in detail with reference to FIG. 2. FIG. 2 is a cross-sectional view showing an enlarged portion 'A' in the light emitting nanostructure 15 of the light emitting device illustrated in FIG. 1.

As illustrated in FIG. 2, width Wb of the second opening H2 is larger than width Wa of the first opening H1, and a portion of the first insulating layer 13a may be exposed along the circumference of the first opening H1 by the second opening H2.

In this structure, the active layer 15b is grown on the surface of the nanocore 15a above the exposed portion of the first insulating layer 13a, and in this case, as illustrated in FIG. 2, the active layer 15b may be formed with an end starting from the surface of first insulating layer 13a. Similarly, the second conductivity-type semiconductor layer 13c may also be formed with an end starting from a surface of the second insulating layer 13b.

In general, a shell structure is provided as a double-layer structure including the active layer 15b and the second conductivity-type semiconductor layer 15c, but in the present embodiment, the active layer 15b may have a portion not in contact with the second conductivity-type semiconductor layer 15c on the surface of the nanocore 15a. The active layer 15b has a portion extending along inner side walls of the second opening H2, the extended portion of the active layer 15b may correspond to thickness t of the second insulating layer 13b.

A leakage current path P formed from the second conductivity-type semiconductor layer 15c to the first conductivity-type nanocore 15a may be formed along a surface of the mask 13. The leakage current path P may be increased as long as the extended portion of the active layer 15b. Namely, in the present embodiment, the leakage current path equaling the thickness t of the second insulating layer 13b is lengthened to drastically reduce a possibility of generating a leakage current.

The active layer 15b may have a multi-quantum well (MQW) structure in which a quantum well layer and a quantum barrier layer are alternately laminated. For example, in the case of a nitride semiconductor, a GaN/InGaN or GaN/AlGaN structure may be used, or a single quantum well (SQW) structure may also be used, as necessary. The second conductivity-type semiconductor layer 15c may be a crystal satisfying p-type $Al_xIn_yGa_{1-x-y}N$, where $0 \le x<1$, $0 \le y<1$, and $0 \le x+y<1$. The second conductivity-type semiconductor layer 15c may further include an electron blocking layer (not shown) in a region adjacent to the active layer 15b. The electron blocking layer (not shown) may have a structure in which a plurality of $In_xAl_yGa_{(1-x-y)}N$ layers, where $0 \le x<1$, $0 \le y<1$, and $0 \le x+y<1$, having different compositions are laminated or may have one or more layers including $Al_yGa_{(1-y)}N$, where $0 \le y<1$. The electron blocking layer has a bandgap wider than that of the active layer 15b, thus preventing electrons from being transferred to the second conductivity-type (p-type) semiconductor layer 15c.

The contact electrode 16 may be obtained by forming a seed layer (not shown) on the surface of the light emitting nanostructures 15 and subsequently performing electroplating thereon. The seed layer (not shown) may be formed of a material appropriate for actualizing ohmic-contact with the second conductivity-type semiconductor layer.

The ohmic-contact material may include at least one of ITO, ZnO, a graphene layer, silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and the contact electrode 16 may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like. For example, the contact electrode 16 may be formed by performing sputtering on an Ag/Ni/Cr layer as a seed layer and subsequently performing electroplating on Cu/Ni.

If necessary, after the contact electrode 16 is formed, a polishing process may be applied to make an upper surface of the contact electrode 16 smooth.

In the present embodiment, the contact electrode 16 may be employed as a reflective metal layer and allow light to be extracted in a direction toward the substrate. However, the present disclosure is not limited thereto and the contact electrode 16 may be formed of a transparent electrode material such as ZnO, graphene, or ITO to allow light to be extracted in a direction toward the light emitting nanostructures 15.

Figure 34:
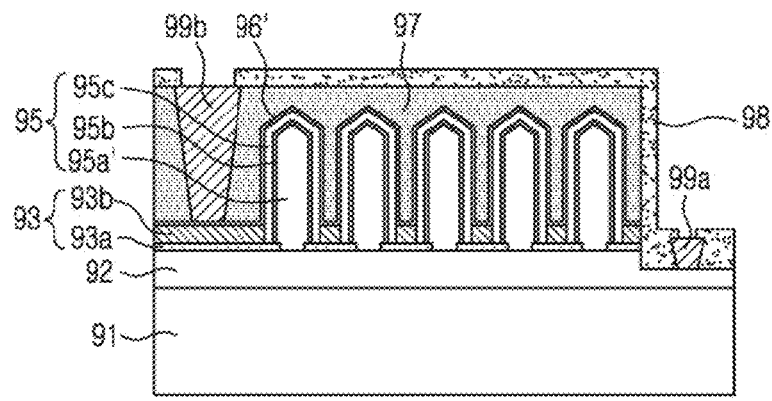

In the present embodiment, the configuration in which the contact electrode 16 fills spaces between the light emitting nanostructures 15, but without being limited thereto, the contact electrode 16 may be formed as a thin layer on the surface of the light emitting nanostructures and a filler material having electrical insulating properties may fill the spaces between the light emitting nanostructures 15 (please refer to FIG. 34).

The novel nanostructure semiconductor light emitting device may be implemented by using various manufacturing methods. FIGS. 3 through 6 are cross-sectional views illustrating major processes of a method for manufacturing the nanostructure semiconductor light emitting device in FIG. 1.

Figure 3:
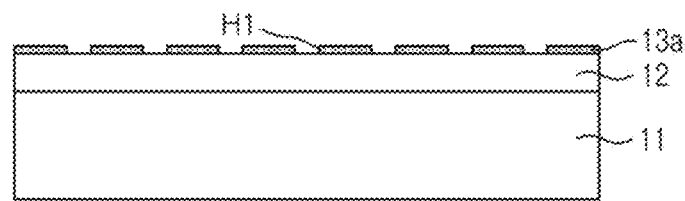
FIGS. 3 through 6 are cross-sectional views illustrating major processes of a method for manufacturing a nanostructure semiconductor light emitting device in FIG. 1.

As illustrated in FIG. 3, the first insulating layer 13a formed of a first conductivity-type semiconductor is formed as a first mask on the base layer 12.

The base layer 12 is formed on the substrate 11, provides a growth surface for growing the light emitting nanostructures, and serves to electrically connect common polarities of the light emitting nanostructures 151 on one side thereof. Thus, as discussed above, the base layer 12 is formed as a semiconductor single crystal having electrical conductivity. When the base layer 12 is directly grown, the substrate 11 may be a substrate for crystal growth.

The substrate 11 may be formed of sapphire, SiC, Si, $MgAl_2O_4$, MgO, $LiAlO_2$, $LiGaO_2$, or GaN. The substrate 11 may have an upper surface on which an irregular pattern S having a hemispherical (convex?) shape is formed. A shape of the irregular pattern S may not be limited to the hemispherical shape and may be variously modified. For example, the irregular pattern S may have a cross-section having a triangular shape, a quadrangular shape, or a trapezoidal shape. By introducing the irregular pattern S, light extraction efficiency may be improved and defect density may be reduced. In consideration of such an effect, factors such as a shape of the cross-section, a size and/or distribution of the irregular pattern S may be variously selected.

The base layer 12 may be a nitride semiconductor satisfying $Al_xIn_yGa_{1-x-y}N$, where $0 \le x <1$, $0 \le y <1$, and $0 \le x+y <1$, and in particular, the base layer 12 may be doped with an n-type impurity such as silicon (Si) to have a specific conductivity-type. For example, a thickness of the base layer 12 provided for the growth of the nanocores 15a may be equal to or greater than 1 μm. In consideration of a follow-up electrode formation process, or the like, the thickness of the base layer 12 may range from 3 μm to 10 μm. The base layer 12 may include GaN having an n-type impurity concentration of $\times 10^{18}/cm^3$ or greater. Before the formation of the base layer 12, a buffer layer may be additionally formed.

In a specific example, the substrate 11 may be a silicon substrate, and in this case, $Al_yGa_{(1-y)}N$, where $0 \le y \le 1$, may be used as a material of the buffer layer. For example, the buffer layer may have a structure in which two or more layers having different compositions are repeatedly stacked a plurality of times. The buffer layer may have a grading structure in which a composition of aluminum (Al) is gradually decreased or increased.

The first insulating layer 13a may have a plurality of first openings H1 exposing a region of the base layer 12. After an insulating material is deposited on the base layer 12 to form the first insulating layer 13a, a plurality of first openings H1 are formed to expose the base layer 12 region. The first insulating layer 13a may be formed of an insulating material such as $SiO_2$ or SiN. A size of the first opening H1 may be designed in consideration of a size of a desired light emitting nanostructure (in particular, a nanocore). For example, a width (diameter) of the first opening H1 may be 600 nm or less, and preferably, may range from 50 nm to 500 nm. A planar shape and arrangement of the first opening H1 may be variously implemented. For example, in case of a planar shape, the first opening H1 may have various shapes such as a polygonal shape, a quadrangular shape, an oval shape, and a circular shape.

Figure 4:
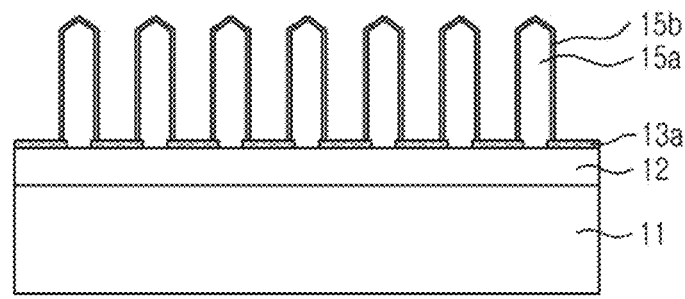

Thereafter, as illustrated in FIG. 4, the nanocores 15a are grown on the base layer 12 exposed through the first openings H1 by using the first insulating layer 13a, and the active layer 15b is subsequently grown.

During this process, a first conductivity-type semiconductor is selectively grown by using the first insulating layer 13a to form the nanocores 15a, and the active layer 15b is formed on the surface of the nanocores 15a on the first insulating layer 13a. The nanocores 15a are formed on the surface of the base layer 12, but the active layer 15b may be formed at a position higher than the first insulating layer 13a.

The first conductivity-type semiconductor of the nanocores 15a may be an n-type nitride semiconductor and may be a crystal satisfying n-type $Al_xIn_yGa_{1-x-y}N$, where $0 \le x \le 1$, $0 \le y <1$, and $0 \le x+y <1$, for example. The first conductivity-type semiconductor constituting the nanocores 15a may be the same material as that of the first conductivity-type semiconductor of the base layer 12. For example, the base layer 12 and the nanocores 15a may be formed of n-type GaN.

The nitride single crystal constituting the nanocores 15a may be formed by using metal-organic chemical vapor deposition (MOCVD) or molecular beam epitaxy (MBE). Here, since crystals are grown in the base layer 12 regions exposed through the first openings H1, rather than on the first insulating layer 13a, desired nanocores 15a may be provided. In the present embodiment, the nanocores 15a have a rod structure, but the present disclosure is not limited thereto and the nanocores 15a may have a polypyramid shape such as a hexagonal pyramid, for example. This may be implemented by regulating growth conditions (for example, a growth temperature, growth pressure, and a flow rate of a source).

The active layer 15b may have a multi-quantum well (MQW) structure in which a quantum well layer and a quantum barrier layer are alternately laminated. For example, in the case of a nitride semiconductor, a GaN/InGaN, or GaN/AlGaN structure may be used, or a single quantum well (SQW) structure may also be used, as necessary.

Figure 5:
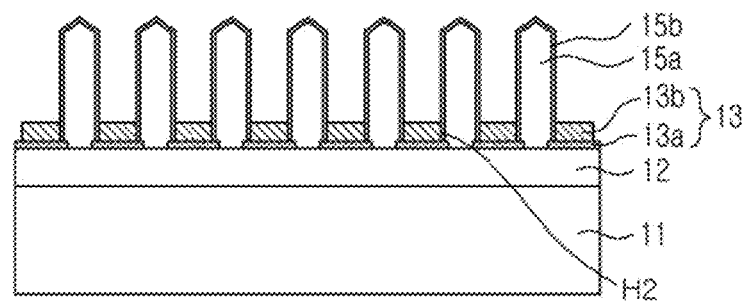

Thereafter, as illustrated in FIG. 5, the second insulating layer 13b may be formed as a second mask on the first insulating layer 13a.

The second insulating layer 13b may be formed of an insulating material such as $SiO_2$ or SiN. In the present embodiment, the second insulating layer 13b may be formed of the same material as that of the first insulating layer 13a. The second opening H2 is provided after the active layer 15b is formed, so the second opening H2 may be formed to surround the active layer 15b. As a result, the active layer 15b may be formed on inner side walls of the second opening H2 by a length corresponding to a thickness of the second insulating layer 13b.

The nanocore 15a may be grown in a lateral direction on the upper surface of the first insulating layer 13a, beyond the first opening H1, and since the active layer 15b is formed on the surface of the nanocore 15a, the second opening H2 may be greater than the first opening H1.

Figure 6:
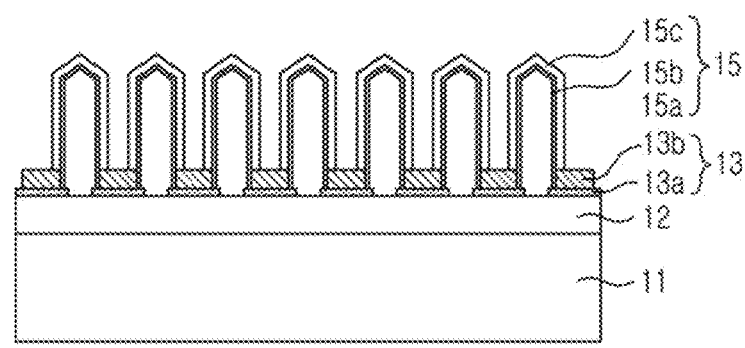

Subsequently, as illustrated in FIG. 6, the second conductivity-type semiconductor layer 15c may be grown on the surface of the active layer 15b by using the second insulating layer 13b.

Through this process, the light emitting nanostructure 15 may have a core-shell structure including the nanocore 15a formed of the first conductivity-type semiconductor and the shell layers including the active layer 15b and the second conductivity-type semiconductor layer 15c covering the nanocores 15a.

The second insulating layer 13b surrounds the active layer 15b formed on the surface of the plurality of nanocores 15a, and the second opening H2 of the second insulating layer 13b may be formed along the outer circumference of the active layer 15b. Also, the second conductivity-type semiconductor layer 15c is formed at a position higher than the second insulating layer 13b.

As a result, as described above with reference to FIG. 2, the active layer 15b may have a portion extending along the inner side wall of the second opening H2 in which the second conductivity-type semiconductor layer 15c does not exist, and since a leakage current path is increased as long as the extended portion, a probability of generating a leakage current may be significantly reduced.

Figure 7:
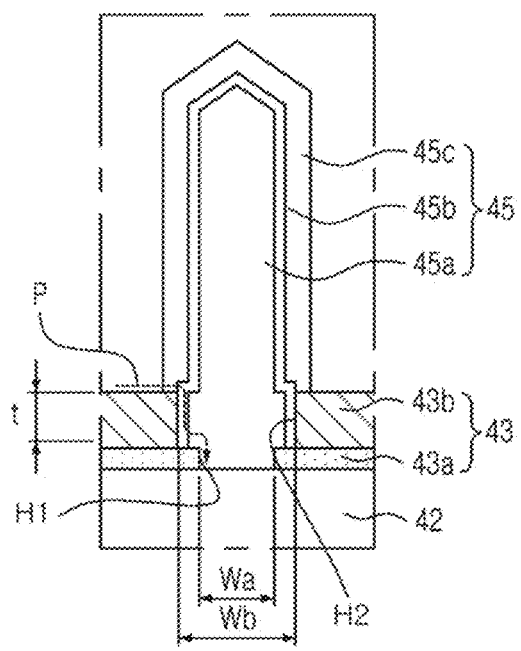
FIG. 7 is a cross-sectional view illustrating a light emitting nanostructure employed in a particular example according to a modification of the present disclosure.

Unlike the process described with reference to FIGS. 3 through 6, the present disclosure may be similarly applied to a configuration in which a mask is used as a mold structure. In this case, a similar light emitting nanostructure may be formed by forming a mask to have a multilayer structure with selectively used materials having different etching rates in a specific etching condition. The light emitting nanostructure may be variously modified to be implemented by using the molding process. FIG. 7 is a cross-sectional view illustrating a light emitting nanostructure employed in a particular example according to a modification of the present disclosure.

A light emitting nanostructure 45 illustrated in FIG. 7 is formed on the base layer 42 formed of a first conductivity-type semiconductor, and includes a nanocore 45a formed of the first conductivity-type semiconductor and an active layer 45b and a second conductivity-type semiconductor layer 45c sequentially formed on the surface of the nanocore 45a.

The light emitting nanostructure 45 and the insulating layer structure illustrated in FIG. 7 may be understood as part of the nanostructure semiconductor light emitting device illustrated in FIG. 1. Descriptions of the components with reference to FIG. 1 may be used as descriptions of the present embodiment unless otherwise specified.

Similar to the embodiment illustrated in FIG. 1, a first insulating layer 43a is formed on the base layer 42. The first insulating layer 43a has a plurality of first openings H1 exposing partial regions of the base layer 42. The second insulating layer 43b is formed on the first insulating layer 43a. The second insulating layer 43b has second openings H2 arranged in positions corresponding to the first openings H1. In this manner, the first and second insulating layers 43a and 43b may be provided as a single mask 43. The first and second insulating layers 43a and 43b may be formed of an insulator that may be used during a semiconductor process. For example, the insulator may be an insulating material such as $SiO_2$ or $SiN_x$.

As illustrated in FIG. 7, the width Wb of the second opening H2 is greater than the width Wa of the first opening H1, and a portion of the first insulating layer 43a may be exposed along the perimeter of the first opening H1 by the second opening H2.

The exposed regions of the base layer 42 are provided by the first openings H1, and a plurality of nanocores 45a formed of the first conductivity-type semiconductor are formed in the exposed regions. The nanocores 45a employed in the present embodiment may be configured such that a sectional area of a region thereof corresponding to the second insulating layer 43b is larger than those of upper and lower regions adjacent thereto.

An active layer 45b is formed on the surface of the nanocores 45a having convex portions. The nanocores 45a are formed on the surface of the base layer 42, but the active layer 45b is formed in a position higher than the first insulating layer 43a. The second insulating layer 43b surrounds the active layer 45b formed on the surface of the plurality of nanocores 45a, and the second opening H2 of the second insulating layer 43b may be formed along the outer circumference of the active layer 45b.

Also, the second conductivity-type semiconductor layer 45c is formed on the surface of the active layer 45b in a position higher than the second insulating layer 43b.

Due to the positions of the shells (the active layer and the second conductivity-type semiconductor layer), a leakage current path may be changed.

In detail, the active layer 45b is grown on the convex surface of the nanocore 45a above the exposed portion of the first insulating layer 43a, and as illustrated in FIG. 4, the active layer 45b may be formed such that an end thereof starts from the surface of the first insulating layer 43a. Similarly, the second conductivity-type semiconductor layer 45c may be formed such that an end thereof may start from the surface of the second insulating layer 43b.

In the present embodiment, the active layer 45b may be provided as a single layer without the second conductivity-type semiconductor layer 45c on the surface of the nanocore 45a in the second opening H2 of the second insulating layer 43b, and since a leakage current path extends by using the convex surface of the nanocore, the leakage current path may be lengthened to be greater than the thickness t of the second insulating layer 43b, significantly reducing a probability of generating a leakage current.

The light emitting nanostructure may be easily implemented by using the multiple insulating layers having different etching rates as a mask in the method for manufacturing the nanostructure semiconductor light emitting device using the mask as a mold. FIGS. 5A through 5E are cross-sectional views illustrating major processes of a method for manufacturing a light emitting device employing the light emitting nanostructure in FIG. 4.

Figure 8:
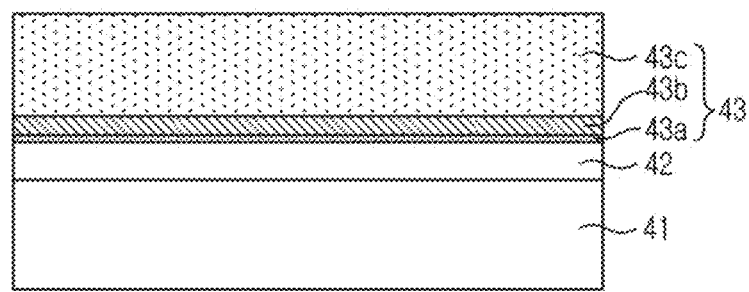
FIGS. 8 through 12 are cross-sectional views illustrating major processes of a method for manufacturing a light emitting device employing the light emitting nanostructure in FIG. 7.

As illustrated in FIG. 8, the base layer 42 is provided on the substrate 41 and the mask 43 having a multi-layer structure is formed on the base layer 42.

The mask 43 employed in the present embodiment includes the first to third insulating layers 43a, 43b, and 43c sequentially formed on the base layer 42. The first and second insulating layers 43a and 43b are formed of a material having electrical insulating properties, and if necessary, the third insulating layer 43c may also be formed of an insulating material.

The first to third insulating layers 43a, 43b, and 43c employed in the present embodiment are selected to satisfy conditions that the second insulating layer 43b has an etching rate higher than those of the first and third insulating layers 43a and 43c during a first etching process and the first and second insulating layers 43a and 43b have an etching rate lower than that of the third insulating layer 43c. The first etching process may be a process of forming openings, during which overetching of the second insulating layer 43b is induced (FIG. 9), and the second etching process may be a process during which the mold is partially removed such that the surface of the light emitting nanostructure is exposed (FIG. 10).

The difference in etching rates may be implemented by using at least one of a kind and density (air gap density) of materials. For example, the first to third insulating layers 43a, 43b, and 43c may be implemented as SiN (high density), SiN (low density), and $SiO_2$, respectively. Alternatively, the first to third insulating layers 43a, 43b, and 43c may be implemented as SiN, $SiO_2$ (low density), and $SiO_2$ (high density), respectively. Here, high density may refer to a state in which there is a very small air gap, or a relatively low air gap density, and low density may refer to a relatively high air gap density.

A total thickness of the first to third insulating layers 43a, 43b, and 43c may be designed in consideration of a height of a desired light emitting nanostructure. The first and second insulating layers 43a and 43b may have a thickness smaller than that of the third insulating layer 43c. An etch stop level of the second insulating layer 43b may be as high as one-third of the overall height of the mask 43 from the surface of the base layer 42, i.e., a total thickness of the first to third insulating layers 43a, 43b, and 43c.

The overall height of the mask 43, i.e., the total thickness of the first to third insulating layers 43a, 43b, and 43c may be greater than 1 µm, preferably, may range from 5 µm to 10 µm. The first and second insulating layers 43a and 43b may be equal to or smaller than 0.5 µm. The second insulating layer 43b serves as a factor for determining an increased leakage current path, so it may be formed to have a thickness of at least 100 nm to achieve a sufficient effect.

Figure 9:
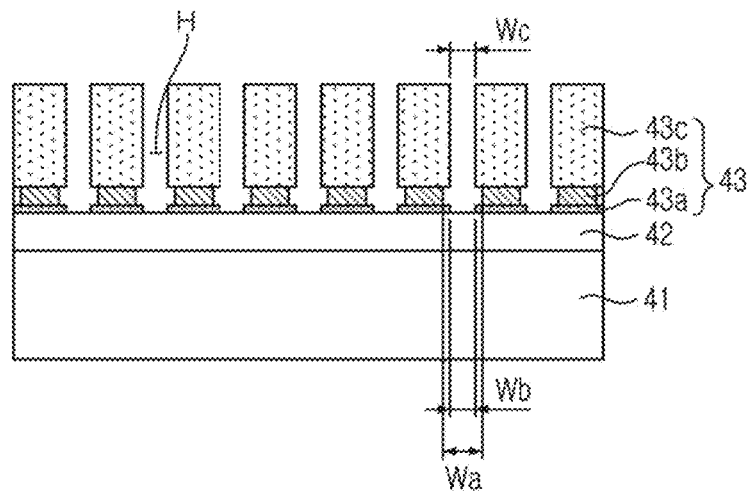
Figure 10:
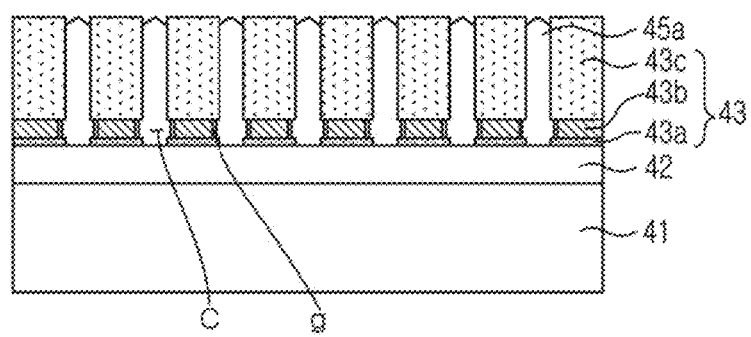

As illustrated in FIG. 9, a plurality of openings H may be formed in the mask 43 having the multi-layer structure The plurality of openings H are formed in the first to third insulating layers 43a, 43b, and 43c sequentially formed on the base layer 42 such that partial regions of the base layer 42 are exposed.

As mentioned above, in the etching conditions (first etching conditions) for forming the plurality of openings H, the second insulating layer 43b has an etching rate higher than those of the first and third insulating layers 43a and 43c, so the second insulating layer 43b is over etched during the process of forming the openings having a predetermined width to have the width Wb greater than the widths Wa and Wc of other regions. As a result, regions positioned in the second insulating layer 43b have openings H formed to have a sectional area larger than those of other upper and lower regions adjacent thereto. Here, the difference between the widths of the openings may be set in consideration of a size of the convex portions C of the nanocores 45 and a thickness of the active layer 45b.

For example, the first, second, and third insulating layers 43a, 43b, and 43c may be implemented as SiN (high density), SiN (low density), and SiO$_2$, respectively, or may be implemented as SiN, SiO$_2$ (low density), and SiO$_2$ (high density), and in this case, a deep etching process using plasma reactive ion etching may be applied. During this etching process, desired overetching of the second insulating layer 43b may be accomplished due to the difference between the degrees of reactivity.

In general, during the deep-etching process, and reactive ions generated from plasma or ion beams generated in high vacuum may be used. The deep-etching process is dry etching allowing for precision machining on a micro-structure without geometric constraints, compared to wet etching. A CF-based gas may be used for oxide film etching of the mask 53. For example, an etchant obtained by combining at least one of O$_2$ and Ar to a gas such as CF$_4$, C$_2$F$_6$, C$_3$F$_8$, C$_4$F$_8$, or CHF$_3$ may be used.

A size of the openings H may be designed in consideration of a size of a desired light emitting nanostructure. For example, the openings H may be formed to have a width (or diameter) equal to or smaller than 600 nm, preferably, range from 50 nm to 500 nm.

The openings H may be formed by using a semiconductor process and may be formed to have a high aspect ratio, for example. The aspect ratio of the openings H may be 5:1 or may even be 10:1.

Thereafter, as illustrated in FIG. 10, a first conductivity-type semiconductor is grown in the exposed regions of the base layer 42 to fill the plurality of openings H, forming the plurality of nanocores 45a.

During the process of growing the first conductivity-type semiconductor, over-growth takes place in the opening H regions corresponding to the second insulating layer 43b, making the nanocores 45a have the convex portion C.

The nitride single crystal constituting the nanocores 45a may be formed by using an MOCVD or MBE process, and the mask 43 may act as a mold for a nitride single crystal to provide the nanocores 45a corresponding to the shape of the openings. Namely, the nitride single crystal is selectively grown in the region of the base layer 42 exposed to the opening H by the mask 43, filling the opening H, and the nitride single crystal filling the opening H may have a shape corresponding to that of the opening H.

Even though the nanocores 45a have the convex portion C, the opening H regions corresponding to the second insulating layer 43a may not be fully filled but have a predetermined gap g. The gap g of the openings H of the second insulating layer 43b may be obtained by adjusting over-etching of a first etching process and over-growth of the nanocores 45b.

The first conductivity-type semiconductor of the nanocores 45a may be an n-type nitride semiconductor and may be a crystal satisfying an n-type Al$_x$In$_y$Ga$_{1-x-y}$N, where 0≤x≤1, 0≤y<1, and 0≤x+y<1, for example. The first conductivity-type semiconductor constituting the nanocores 45a may be the same material as the first conductivity-type semiconductor of the base layer 42. For example, the base layer 42 and the nanocores 45a may be formed of n-type GaN.

Figure 11:
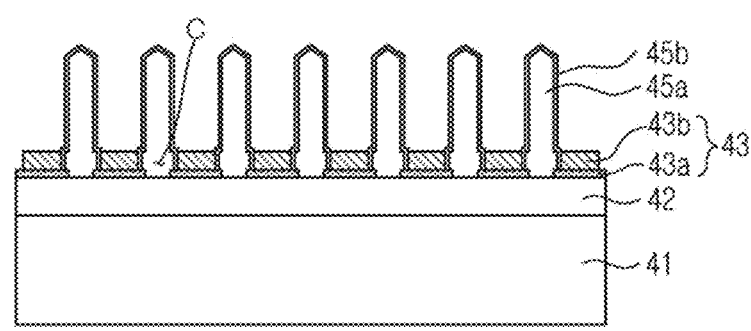

Thereafter, as illustrated in FIG. 11, the mask 43 is partially removed by using the second insulating layer 43b as an etch stop layer such that side surfaces of the plurality of nanocores 45 are exposed, and the active layer 45b is subsequently grown on the surfaces of the nanocores 45a.

As discussed above, this etching process (second etching process) is performed under the conditions that the third insulating layer 43c is selectively removed, so the first and second insulating layers 43a and 43b remain. The second insulating layer 43b is employed as an etch stop layer during this etching process and may serve, together with the first insulating layer 43a, to prevent the second conductivity-type semiconductor layer 45c from being connected to the base layer 42 in a follow-up growth process.

In this manner, the third insulating layer 43c is selectively removed, and the active layer 45b may be subsequently grown. During this process, the active layer 45b may also be formed in the gap g surrounded with the openings H of the second insulating layer 43b and the opening, rather than being limited to the surfaces of the nanocores 45a corresponding to positions higher than the second insulating layer 43b. during this process, the gap g may be filled by the active layer 45b.

After the mask 43 is partially removed, the nanocores 45a may be heat-treated before the active layer 45b is grown. Through the heat treatment process, the surfaces of the nanocores 45a are formed as stable crystal planes such as non-polar planes or semipolar planes, enhancing quality of crystals grown in a follow-up process. This will be described later with reference to FIGS. 26 and 27.

Figure 12:
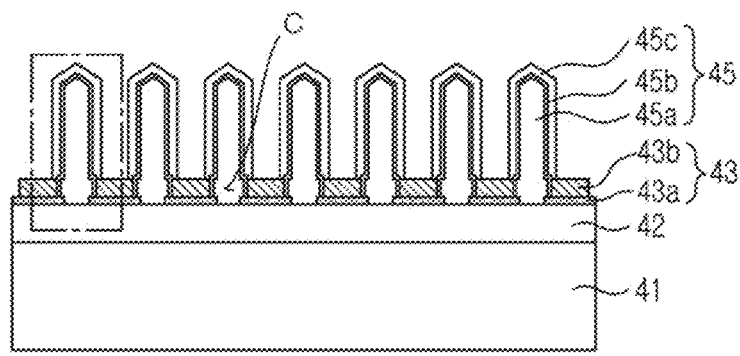

Subsequently, as illustrated in FIG. 12, the second conductivity-type semiconductor layer 45c is grown on the surface of the active layer 45b by using the second insulating layer 43b.

Through such a process, the light emitting nanostructure 45 may have a core-shell structure including the nanocore 45a formed of the first conductivity-type semiconductor and the shell layers including the active layer 45b and the second conductivity-type semiconductor layer 45c covering the nanocores 45a.

In the opening (H) region of the second insulating layer 43b, the active layer 45b is positioned on and surrounds the surfaces of the plurality of nanocores 45a, but the second conductivity-type semiconductor layer 45c is not present in the region. That is, the second conductivity-type semiconductor layer 45c is formed in a position higher than the second insulating layer 43b.

That is, since the active layer 45b is grown on the convex portion C of the nanocore 45a positioned in the exposed portion of the first insulating layer 43a, an end of the active layer 45b may be positioned to reach the surface of the first insulating layer 43a. Similarly, an end of the second conductivity-type semiconductor layer 45c may also be positioned to reach the surface of the second insulating layer 43b.

In the present embodiment, the active layer 45b may be provided as a single layer without the second conductivity-type semiconductor layer 45c on the surface of the nanocore 45a in the second opening of the second insulating layer 43b, and since a leakage current path extends by using the convex portion C of the nanocore 45a, the leakage current path may be lengthened to be greater than the thickness of the second insulating layer 43b, and thus, as a result, a probability of generating a leakage current may be significantly reduced.

Figure 13:
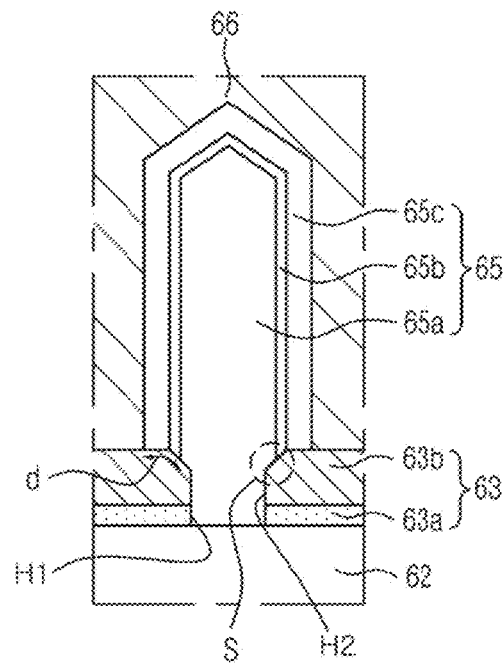
FIG. 13 is a cross-sectional view illustrating a light emitting nanostructure employed in another example according to an exemplary embodiment of the present inventive concept.

In another exemplary embodiment of the present inventive concept, an inner side wall of the second opening may have an upwardly sloped surface and an end of the active layer may be positioned on the sloped surface. FIG. 13 is a cross-sectional view illustrating a light emitting nanostructure employed in such an embodiment.

Similar to the foregoing embodiment, a light emitting nanostructure 65 illustrated in FIG. 13 is formed on a base layer 62 formed of a first conductivity-type semiconductor, and includes a nanocore 65a formed of the first conductivity-type semiconductor and an active layer 65b and a second conductivity-type semiconductor layer 65c sequentially formed on the surface of the nanocore 65a.

The light emitting nanostructure 65 and the insulating layer structure illustrated in FIG. 13 may be understood as part of the nanostructure semiconductor light emitting device illustrated in FIG. 1. Description of the respective components with reference to FIG. 1 may be cited for reference as descriptions of the present embodiment unless otherwise specified.

Similarly to the foregoing embodiment, a first insulating layer 63a is formed on the base layer 62. The first insulating layer 63a has a plurality of first openings H1 exposing partial regions of the base layer 62. The second insulating layer 63b is formed on the first insulating layer 63a. The second insulating layer 63b has second openings H2 arranged in positions corresponding to the first openings H1. In this manner, the first and second insulating layers 63a and 63b may be provided as a single mask 63. The first and second insulating layers 63a and 63b may be formed of an insulator that may be used during a semiconductor process. For example, the insulator may be an insulating material such as $SiO_2$ or $SiN_x$.

As illustrated in FIG. 13, unlike the first opening H1, the second opening H2 may have a sloped surface S formed to be sloped upwardly, and an upper end portion of the second opening H2 may have a width greater than those of other regions.

The exposed regions of the base layer 62 are provided by the first openings H1, and the nanocores 65a formed of the first conductivity-type semiconductor are formed in the exposed regions. An end of the active layer 65b may be positioned on the sloped surface S of the second insulating layer 63b so as to be formed at a position higher than the first insulating layer 63a. The second insulating layer 63b may surround a portion of the active layer 65b formed on the surface of the plurality of nanocores 65a.

Also, the second conductivity-type semiconductor layer 65c is formed on the surface of the active layer 65b positioned to be higher than the second insulating layer 63b. Due to the position of the shells (the active layer and the second conductivity-type semiconductor layer), a leakage current path ma also be changed.

In detail, an end of the active layer 65b is positioned on the sloped surface S of the second insulating layer 63b and the second conductivity-type semiconductor layer 65c may be formed such that an end thereof starts from a surface of the second insulating layer 63b. Accordingly, a leakage current path d is lengthened to be as long as the active layer 65b, reducing a probability of generating a leakage current.

Figure 14:
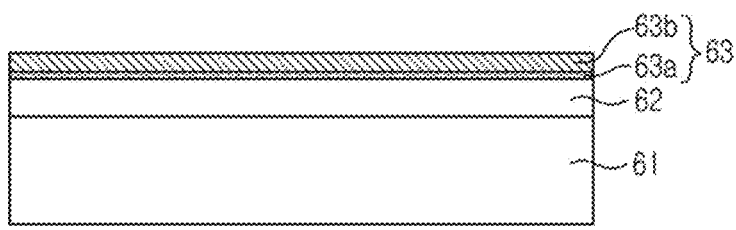
FIGS. 14 through 16 are cross-sectional views illustrating major processes of a method for manufacturing a light emitting device employing the light emitting nanostructure in FIG. 13.
Figure 15:
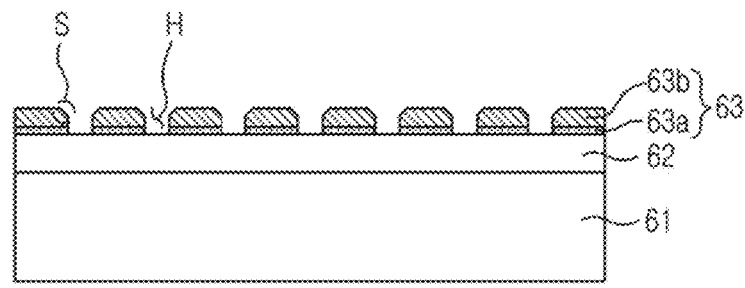
Figure 16:
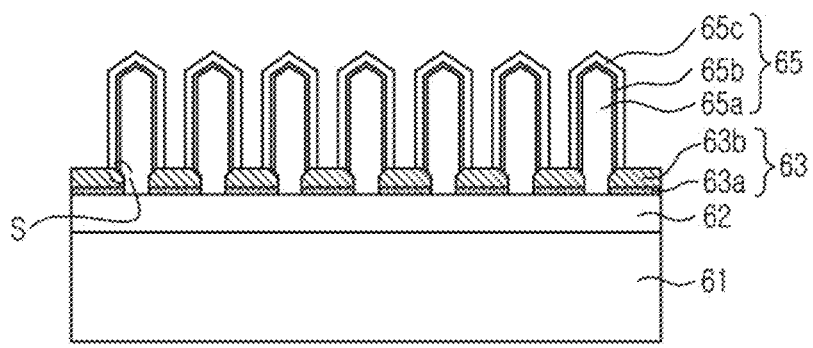

Such a light emitting nanostructure may be easily implemented through a method for manufacturing multiple insulating layers having different etching rates as a mask. FIGS. 14 through 16 are cross-sectional views illustrating major processes of a method for manufacturing the semiconductor light emitting device of FIG. 13 using a dual-layer mask.

As illustrated in FIG. 14, the base layer 62 is formed on a substrate 61, and a mask 63 having a dual-layer structure is formed on the base layer 62.

The mask 63 employed in the present embodiment includes first and second insulating layers 63a and 63b sequentially formed on the base layer 62. The first and second insulating layers 63a and 63b may be formed of a material having electrical insulating properties.

The first and second insulating layers 63a and 63b employed in the present exemplary embodiment may be selected to meet the requirements that the second insulating layer 63b has an etching rate higher than that of the first insulating layer 63a during an etching process to form openings.

The difference in etching rates may be implemented by using at least one of a kind and density (air gap density) of materials. For example, the first and second insulating layers 63a and 63b may be formed of different materials in order to induce a desired difference in etching rates. The first insulating layer 63a may be formed of SiN and the second insulating layer 63b may be formed of $SiO_2$. Alternatively, a difference in etching rates may be implemented by using an air gap density. In this case, the first and second insulating layers 63a and 63b may be formed of materials having different air gap densities.

As illustrated in FIG. 15, a plurality of openings H may be formed in the mask 63 having a dual-layer structure.

A plurality of openings H are formed in the first and second insulating layers 63a and 63b sequentially formed in the base layer 62 such that partial regions of the base layer 62 are exposed.

As mentioned above, in the etching conditions for forming the plurality of openings, since the second insulating layer 63b has an etching rate higher than that of the first insulating layer 63a, the second insulating layer 63b is over-etched to have an upwardly sloped surface.

In this case, desired overetching of the second insulating layer 63b may be accomplished by a difference in degrees of reactivity by using an etching process such as a plasma reactive ion etching process.

A size of the openings H may be designed in consideration of a size of a desired light emitting nanostructure. For example, the openings H may be formed to have a width equal to or smaller than 600 nm, preferably, range from 50 nm to 500 nm.

Thereafter, as illustrated in FIG. 16, a first conductivity-type semiconductor is grown in the exposed regions of the base layer 62 by using the mask 63 to form a plurality of nanocores 65a, and the active layer 65b and the second conductivity-type semiconductor layer 65c are sequentially grown on the surface of the nanocores 65a.

Such a process may be implemented by using an MOCVD or MBE process in case of employing a nitride single crystal. Through this process, the nanocores 65a formed of the first conductivity-type semiconductor are formed in the exposed regions and the active layer 65b may be formed such that an end thereof is positioned on the sloped surface S of the second insulating layer 63b, so as to be positioned to be higher than the first insulating layer 63a. The second insulating layer 63b may surround a portion of the active layer 65b formed on the surfaces of the plurality of nanocores 65a.

In detail, an end of the active layer 65b is positioned on the sloped surface S of the second insulating layer 63b, and an end of the second conductivity-type semiconductor layer 65c may be formed, starting from the surface of the second insulating layer 63b. Accordingly, the leakage current path is lengthened to be as long as the active layer 65b portion positioned on the sloped surface S, reducing leakage current generation probability.

Figure 17:
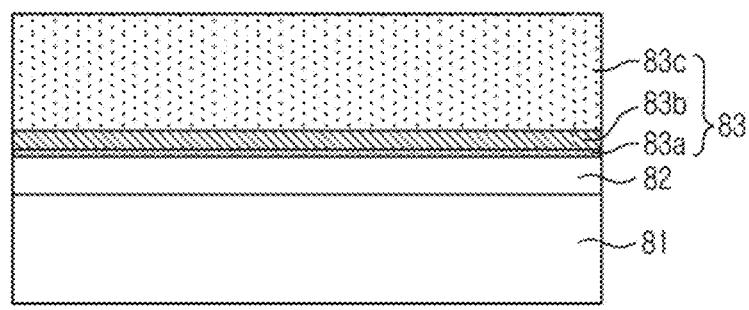
FIGS. 17 and 18 are cross-sectional views illustrating processes using a different multi-layer mask for obtaining the light emitting nanostructure in FIG. 16.
Figure 18:
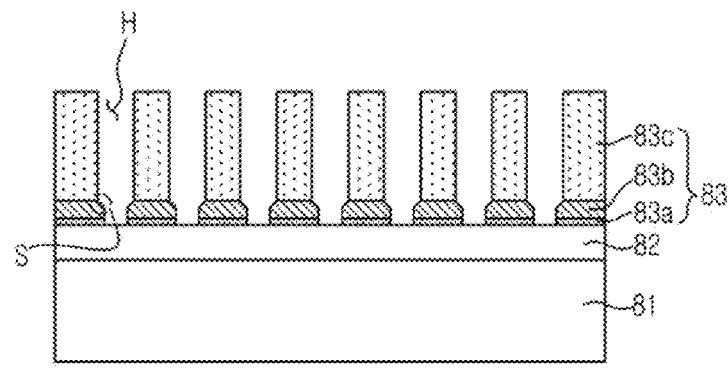

A similar mask structure may be implemented through a manufacturing method using a mold. FIGS. 17 and 18 are cross-sectional views illustrating processes using a tri-layer mask (mold) for obtaining the light emitting nanostructure in FIG. 16.

As illustrated in FIG. 17, a base layer 82 is provided on a substrate 81, and a mask 83 having a multi-layer structure is formed on the base layer 82.

The mask 83 employed in the present embodiment includes first to third insulating layers 83a, 83b, and 83c sequentially formed on the base layer 82. The first and second insulating layers 83a and 83b are formed of a material having electrical insulating properties, and the third insulating layer 83c may also be formed of an insulating material.

The first to third insulating layers 83a, 83b, and 83c employed in the present embodiment are selected to satisfy conditions that etching rates are higher in order of the first insulating layer 83a, the second insulating layer 83b, and the third insulating layer 83c during a first etching process and the third insulating layer 83c has an etching rate as low as to be selectively removed during a second etching process. The first etching process may be a process of forming openings H, during which a sloped surface S is introduced to the second insulating layer 83b, and the second etching process may be a process of partially removing a mold such that a surface of the light emitting nanostructure is exposed.

The difference in etching rates may be implemented by using at least one of a type and density (air gap density) of a material. For example, the first to third insulating layers 83a, 83b, and 83c may be implemented as SiN—SiO$_2$ (low density)-SiO$_2$ (high density), respectively. Here, high density may refer to a state in which there is a very small air gap, or a relatively low air gap density, and low density may refer to a relatively high air gap density.

A total thickness of the first to third insulating layers 83a, 83b, and 83c may be designed in consideration of a height of a desired light emitting nanostructure. The first and second insulating layers 83a and 83b may have a thickness smaller than that of the third insulating layer 83c. An etch stop level of the second insulating layer 83b may be as high as one-third of the overall height of the mask 83 from the surface of the base layer 82, i.e., a total thickness of the first to third insulating layers 83a, 83b, and 83c.

As illustrated in FIG. 18, a plurality of openings H may be formed in the mask 83 having the triple-layer structure The plurality of openings H are formed in the first to third insulating layers 83a, 83b, and 83c sequentially formed on the base layer 82 such that partial regions of the base layer 82 are exposed.

As mentioned above, in the etching conditions (first etching conditions) for forming the plurality of openings H, the first to third insulating layers 83a, 83b, and 83c have etching rates which are sequentially low. Thus, as illustrated, a width of the opening of the third insulating layer 83c is greater than that of the opening of the first insulating layer 83a and the second insulating layer 83b has a sloped surface sloped upwardly.

For example, as mentioned above, the mask 83 may be implemented as SiN—SiO$_2$ (low density)-SiO$_2$ (high density), respectively, and in this case, a deep etching process using plasma reactive ion etching may be applied. By using appropriate differences in reactive etching conditions and degrees of density, a profile different from that of the openings illustrated in FIG. 9 may be obtained. The triple-layer mask 83 used as a mold may also be used to obtain the light emitting nanostructure illustrated in FIG. 13.

In the foregoing embodiment, a method for improving a leakage current path from the second conductivity-type semiconductor layer to the nanocores is proposed. However, besides, in actuality, a leakage current path from the metal electrode (contact electrode) to the nanocores may also affect the leakage current characteristics. In this case, the second conductivity-type semiconductor layer having a level of conductivity lower than that of metal, in addition to the active layer, should also be taken into account, over the leakage current path.

Hereinafter, a method for extending a leakage current path from the contact electrode to the nanocores according to another exemplary embodiment of the present inventive concept will be described.

Figure 19:
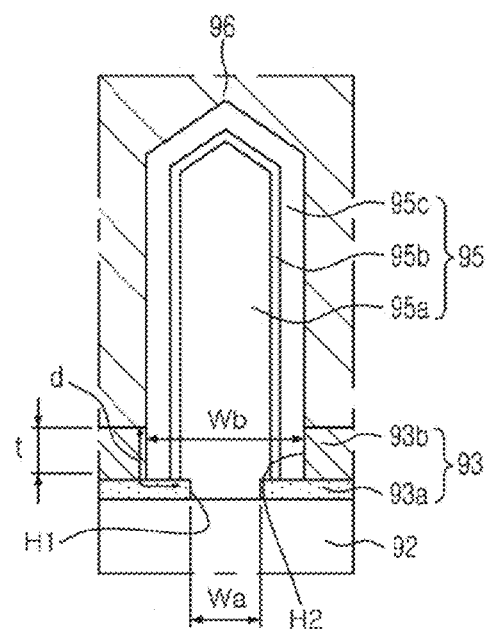
FIG. 19 is a cross-sectional view illustrating a light emitting nanostructure employed in another exemplary embodiment of the present inventive concept.

FIG. 19 is a cross-sectional view illustrating a light emitting nanostructure employed in another exemplary embodiment of the present inventive concept.

The light emitting nanostructure 95 illustrated in FIG. 19 is formed on a base layer 92 formed of a first conductivity-type semiconductor, and includes a nanocore 95a formed of the first conductivity-type semiconductor and an active layer 95b and a second conductivity-type semiconductor layer 95c sequentially formed on the surface of the nanocore 95a.

The light emitting nanostructure 95 and the insulating layer structure illustrated in FIG. 19 may be understood as part of the nanostructure semiconductor light emitting device illustrated in FIG. 1. Descriptions of the components with reference to FIG. 1 may be used as descriptions of the present embodiment unless otherwise specified.

Similar to the embodiment illustrated in FIG. 1, in the present exemplary embodiment, a first insulating layer 93a is formed on the base layer 92. The first insulating layer 93a has a plurality of first openings H1 exposing partial regions of the base layer 92. The second insulating layer 93b is formed on the first insulating layer 93a. The second insulating layer 93b has second openings H2 arranged in positions corresponding to the first openings H1. In this manner, the first and second insulating layers 93a and 93b may be provided as a single mask. The first and second insulating layers 93a and 93b may be formed of an insulator that may be used during a semiconductor process. For example, the insulator may be an insulating material such as SiO$_2$ or SiN$_x$.

As illustrated in FIG. 19, the width Wb of the second opening H2 is greater than the width Wa of the first opening H1, and a portion of the first insulating layer 93a may be exposed along the perimeter of the first opening H1 by the second opening H2.

The exposed regions of the base layer 92 are provided by the first openings H1, and the nanocores 95a formed of the first conductivity-type semiconductor are formed in the exposed regions and the active layer 95b and the second conductivity-type semiconductor layer 95c are sequentially formed on the surfaces of the nanocores 95a.

The nanocores 95a are formed on the surface of the base layer 92, but the active layer 95b and the second conductivity-type semiconductor layer 95c may be formed at positions higher than the first insulating layer 93a. The second insulating layer 93b surrounds the active layer 95b and the second conductivity-type semiconductor layer 95c formed on the surfaces of the plurality of nanocores 95a, and the second opening H2 of the second insulating layer 93b is formed along the perimeter of the light emitting nanostructure 95.

Meanwhile, a contact electrode 96 electrically connected to the second conductivity-type semiconductor layer 95c is formed on the surface of the second conductivity-type semiconductor layer 95c positioned to be higher than the second insulating layer 93b.

With such a structure, a leakage current path between the contact electrode 96 and the nanocores 95a may be changed.

In detail, a path d extending as long as the extended portion of the second conductivity-type semiconductor layer 95c (equal to the thickness of the second insulating layer 93b) which corresponds to the opening of the second insulating layer 93b and is not in direct contact with the contact electrode 96 and thicknesses of the second conductivity-type semiconductor layer 95c and the active layer 95b, is formed. Due to the lengthened path d, a probability of generating a leakage current may be significantly reduced.

The light emitting nanostructure may be easily implemented by using the multiple insulating layers having different etching rates as a mask in the method for manufacturing the nanostructure semiconductor light emitting device using the mask as a mold. FIGS. 20 through 24 are cross-sectional views illustrating major processes of a method for manufacturing a light emitting device employing the light emitting nanostructure in FIG. 9.

Figure 20:
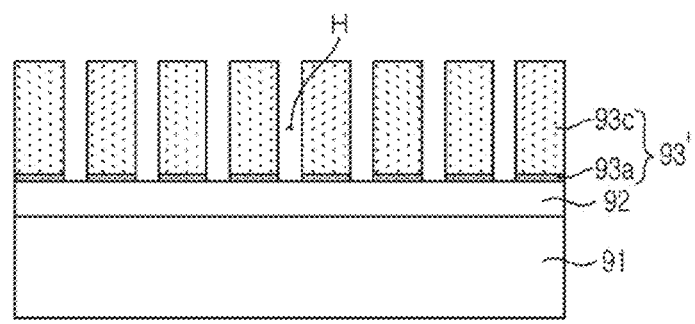
FIGS. 20 through 25 are cross-sectional views illustrating major processes of a method for manufacturing a light emitting device employing the light emitting nanostructure in FIG. 19.

As illustrated in FIG. 20, the base layer 92 is provided on a substrate 91, and a first mask 93' having a plurality of openings H is formed on the base layer 92.

The first mask 93' employed in the present embodiment includes first and third insulating layers 93a and 93c sequentially formed on the base layer 92. The first insulating layer 93a may be formed of a material having electrical insulating properties, and the third insulating layer 93c may also be formed of an insulating material as necessary.

In specific etching conditions, the first insulating layer 93a may have an etching rate lower than that of the third insulating layer 93c, serving as an etch stop layer. The difference in etching rates may be implemented by using at least one of a kind and density (air gap density) of materials.

A total thickness of the first and third insulating layers 93a and 93c may be designed in consideration of a height of a desired light emitting nanostructure.

A plurality of openings H are formed in the first and third insulating layers 93a and 93c sequentially formed on the base layer 92 such that partial regions of the base layer 92 are exposed.

Figure 21:
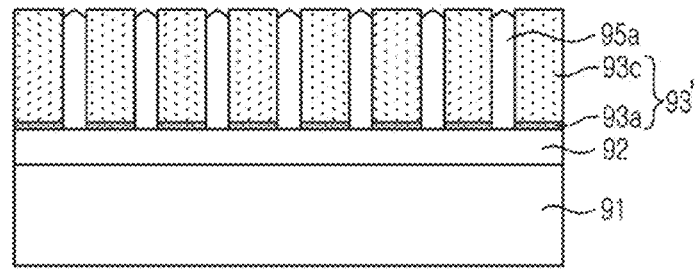

Thereafter, as illustrated in FIG. 21, a first conductivity-type semiconductor is grown in exposed regions of the base layer 92 such that the plurality of openings H are filled, forming a plurality of nanocores 95a.

The first conductivity-type semiconductor of the nanocores 95a may be n-type nitride semiconductor satisfying n-type $Al_xIn_yGa_{1-x-y}N$, where $0 \leq x \leq 1$, $0 \leq y < 1$, and $0 \leq x+y < 1$, for example. The first conductivity-type semiconductor constituting the nanocores 95a may be the same material as the first conductivity-type semiconductor of the base layer 92. For example, the base layer 92 and the nanocores 95a may be formed of n-type GaN.

The nitride single crystal constituting the nanocores 95a may be formed by using an MOCVD or MBE process, and the mask 93 may act as a mold for a nitride single crystal to provide the nanocores 95a corresponding to the shape of the openings. Namely, the nitride single crystal is selectively grown in the region of the base layer 92 exposed to the opening H by the first mask 93', filling the opening H, and the nitride single crystal filling the opening H may have a shape corresponding to that of the opening H.

Figure 22:
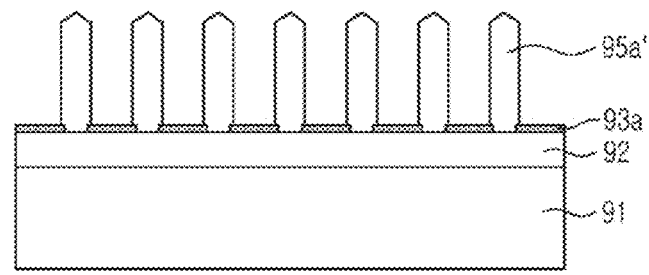

Thereafter, as illustrated in FIG. 22, the first mask 93' is partially removed by using the etch stop layer such that side surfaces of the plurality of nanocores 95a are exposed, and a heat treatment process is applied thereto.

In the present embodiment, an etching process under the conditions that the third insulating layer 93c is selectively removed is applied to remove only the third insulating layer 93c, while leaving the first insulating layer 93a. The first insulating layer 93a is employed as an etch stop layer during this etching process and may serve to prevent the active layer 95b and the second conductivity-type semiconductor layer 95c from being connected to the base layer 92 in a follow-up growth process.

Figure 23:
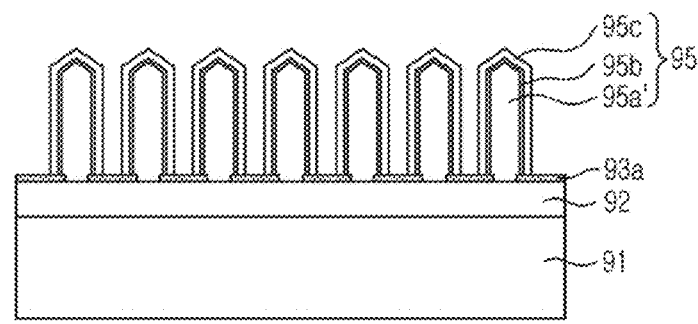

In the present embodiment, an additional heat treatment process may be introduced to enhance crystallinity during a process of manufacturing the light emitting nanostructure using the mask having the openings as a mold. Nanocores 95a' having improved surface crystallinity after being heat-treated are illustrated in FIG. 23.

Figure 26:
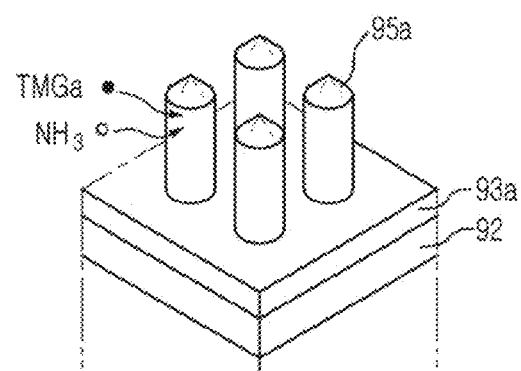
FIGS. 26 and 27 are schematic views illustrating a heat treatment process employed in FIG. 22.
Figure 27:
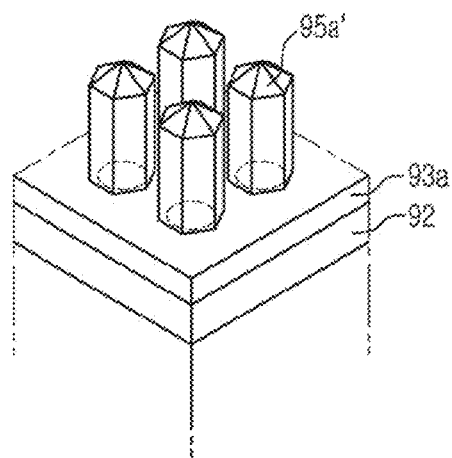

After the first mask 93' is partially removed, the surfaces of the nanocores 95a are heat-treated under predetermined conditions to change crystal planes of the nanocores 95a into stable surfaces advantageous for crystal growth like a semi-polar or non-polar surface. This heat treatment process will be described with reference to FIGS. 26 and 27. FIGS. 26 and 27 are schematic views illustrating a heat treatment process (or an annealing process) employed in FIG. 22.

FIG. 26 illustrates the nanocores 95a obtained in FIG. 21. The nanocores 95a have crystal planes determined according to a shape of openings. Although varied according to a shape of openings H, surfaces of the nanocores 95a obtained thusly generally have relatively unstable crystal planes, which is not advantageous for a follow-up crystal growth.

In the present embodiment, when openings have a cylindrical rod shape, side surfaces of the nanocores have a curved surface, rather than a particular crystal plane, as illustrated in FIG. 26.

When the nanocores are heat-treated, the unstable crystals on surfaces thereof are rearranged to have stable crystal planes such as semipolar or non-polar surfaces as illustrated in FIG. 27. The heat treatment may be performed at a temperature of 600° C. or higher, and in a specific example, at a temperature ranging from 800° C. to 1200° C., for a few seconds to tens of minutes (1 second to minutes) to change the unstable crystal planes into desired stable crystal planes.

In the heat treatment process, if the substrate temperature is lower than 600° C., it is difficult to grow and rearrange crystals of the nanocores, making it difficult to obtain a heat treatment effect, and if the substrate temperature is lower than 1200° C., nitrogen (N) is evaporated from the GaN crystal planes to degrade crystal quality. Also, for a period of time shorter than 1 second, it is difficult to obtain a sufficient heat treatment effect, and a heat treatment performed for tens of minutes, for example, for a period of time longer than 60 minutes, may degrade the manufacturing process.

For example, when the nanocore 55 is grown using a C (0001) plane of the sapphire substrate ((111) plane in case of a silicon substrate), a nanocore 95 having a cylindrical shape illustrated in FIG. 26 may be heat-treated in an appropriate temperature range as mentioned above to convert a curved surface (side surface), an unstable crystal plane, into hexagonal crystal column (95' in FIG. 27) having a non-polar surface (m plane) as a stable crystal plane. Stabilization of the crystal plane may be realized through the heat treatment process performed at a high temperature.

Although it is difficult to clearly explain such a principle, in a case in which crystals positioned on the surface at a relatively high temperature are re-aligned or a source gas remains in a chamber, it can be understand that partial re-growth is performed to have a stable crystal plane through deposition of the remaining source gas.

In particular, in view of re-growth, a heat treatment process may be performed in an atmosphere in which source gas remains in a chamber, or a heat treatment may be performed in a condition of intentionally supplying a relatively small amount of source gas. For example, as shown in FIG. 26, in the case of an MOCVD chamber, TMGa and $NH_3$ remain, and in this residual atmosphere, the heat treatment is performed such that source gas reacts with a nanocore surface to thus realize partial re-growth so as to have a stable crystal plane. Due to this regrowth, widths of the heat-treated nanocores 95a' may be slightly increased, relative to those of the nanocores 95a prior to the heat treatment process.

In this manner, crystallinity of the nanocores may be enhanced by introducing the additional heat treatment process. Namely, through the heat treatment process, non-uniformity (for example, a defect, or the like) present on the surfaces of nanocores after the removal of the mask may be removed and stability of the internal crystals may be greatly enhanced through rearrangement. The heat-treatment process may be performed under conditions similar to those of the growth process of the nanocores within a chamber after the removal of the mask. For example, the heat treatment process may be performed at a temperature (for example, a substrate temperature) ranging from 800° C. to 1200° C., but a similar effect may also be obtained even with a heat treatment process performed at a temperature equal to or higher than 600° C.

Thereafter, as illustrated in FIG. 23, the active layer 95b and the second conductivity-type semiconductor layer 95c are sequentially grown on the surfaces of the plurality of nanocores 95a'.

Through this process, the light emitting nanostructure 95 may have the core-shell structure including the nanocores 95a' formed of the first conductivity-type semiconductor and the shell layers made up of the active layer 95b and the second conductivity-type semiconductor layer 95c covering the nanocores 95a'.

The active layer 95b may have a multi-quantum well (MQW) structure in which a quantum well layer and a quantum barrier layer are alternately laminated. For example, in the case of a nitride semiconductor, a GaN/InGaN or GaN/AlGaN structure may be used, or a single quantum well (SQW) structure may also be used, as necessary.

The second conductivity-type semiconductor layer 95c may be a crystal satisfying p-type $Al_xIn_yGa_{1-x-y}N$, where $0 \leq x \leq 1$, $0 \leq y < 1$, and $0 \leq x+y < 1$. The second conductivity-type semiconductor layer 95c may further include an electron blocking layer (not shown) in a region adjacent to the active layer 95b. The electron blocking layer (not shown) may have a structure in which a plurality of $In_xAl_yGa_{(1-x-y)}N$ layers, $0 \leq x \leq 1$, $0 \leq y < 1$, and $0 \leq x+y < 1$, having different compositions are laminated or may have one or more layers including $Al_yGa_{(1-y)}N$, where $0 \leq y < 1$. The electron blocking layer has a bandgap wider than that of the active layer 95b, thus preventing electrons from flowing to the second conductivity-type (p-type) semiconductor layer 95c.

Figure 24:
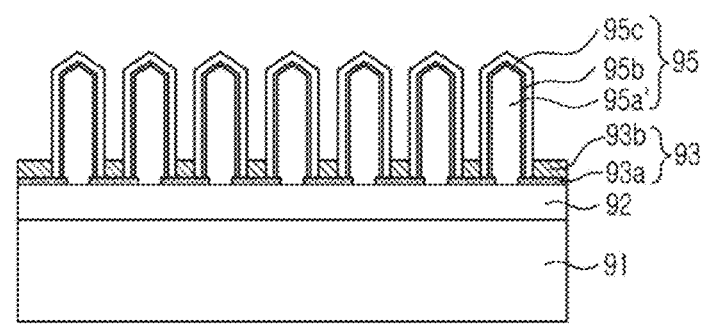

Thereafter, as illustrated in FIG. 24, a second insulating layer is formed on the first insulating layer 93a to form a second mask 93.

The insulating layer 93b may be formed of an insulating material such as $SiO_2$ or SiN. In the present embodiment, the second insulating layer 93b may be formed of the same material as that of the first insulating layer 93b. Since the second insulating layer 93b is provided after the active layer 95b and the second conductivity-type semiconductor layer 95c are formed, the second insulating layer 93b may be formed to surround the light emitting nanostructures 95.

Figure 25:
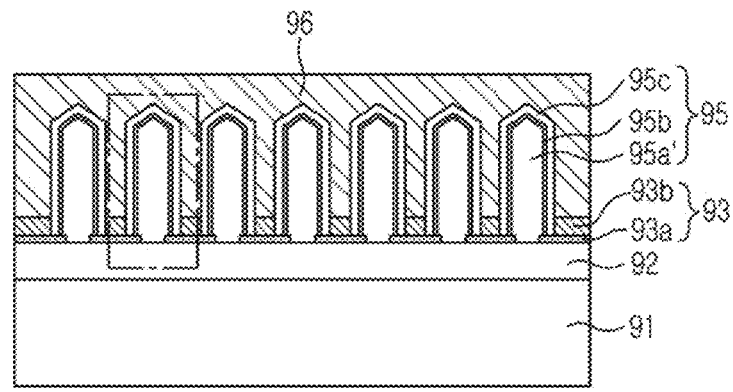

Thereafter, as illustrated in FIG. 25, the contact electrode 96 is formed on the surface of the second conductivity-type semiconductor layer 95c using the second mask 93.

The contact electrode 96 may be obtained by forming a seed layer (not shown) on the surface of the light emitting nanostructures 15 and subsequently performing electroplating thereon. The seed layer (not shown) may be formed of a material appropriate for forming ohmic-contact with the second conductivity-type semiconductor layer 95c.

In such a structure, a leakage current path between the contact electrode 96 and the nanocores 96a has a path d extending as long as the extended portion of the second conductivity-type semiconductor layer 95c (equal to the thickness t of the second insulating layer 93b) which corresponds to the opening of the second insulating layer 93b and is not in direct contact with the contact electrode 96 and thicknesses of the second conductivity-type semiconductor layer 95c and the active layer 95b, is formed. Due to the lengthened path d, a probability of generating a leakage current may be significantly reduced.

If necessary, after the contact electrode 96 is formed, a polishing process may be performed to make the contact electrode 96 have a smooth upper surface.

In the present embodiment, the contact electrode 96 is formed of a reflective metal layer and serves to extract light in a direction toward the substrate, but the present disclosure is not limited thereto and the contact electrode 96 may be formed of a transparent electrode material such as ZnO, graphene, or ITO to allow light to be extracted in a direction toward the light emitting nanostructures 95.

In the present embodiment, the configuration in which the contact electrode 96 fills spaces between the light emitting nanostructures 95, but without being limited thereto, the contact electrode may be formed as a thin layer on the surface of the light emitting nanostructures and a filler material having electrical insulating properties may fill the spaces between the light emitting nanostructures 95.

In the aforementioned embodiment, the second insulating layer 93b may be provided by performing a surface oxidation process on the first insulating layer 93a, rather than forming the first insulating layer 93a through an additional deposition process. This embodiment is illustrated in FIG. 12.

Figure 28:
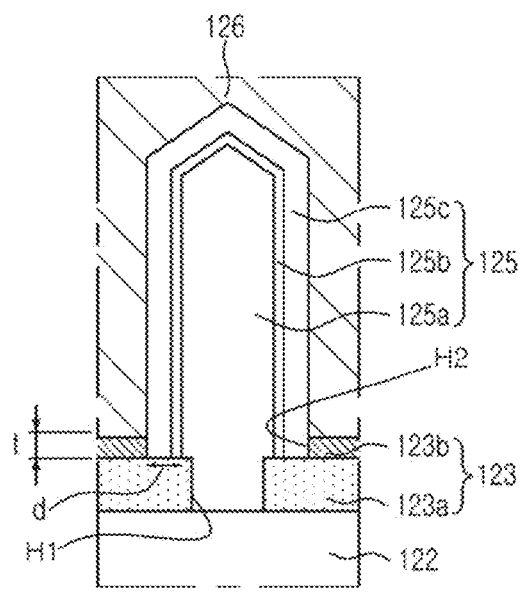
FIG. 28 is a cross-sectional view illustrating a light emitting nanostructure employed in another exemplary embodiment of the present inventive concept.

A light emitting nanostructure 125 illustrated in FIG. 28 is formed on a base layer 122 formed of a first conductivity-type semiconductor and includes a nanocore 125a formed of the first conductivity-type semiconductor and an active layer 125b and a second conductivity-type semiconductor layer 125c sequentially formed on the surface of the nanocore 125a.

Similar to the embodiment illustrated in FIG. 19, In the light emitting nanostructure 125 and insulating layer structure illustrated in FIG. 28, a first insulating layer 123a is formed on the base layer 122. The first insulating layer 123a has a plurality of first openings H1 exposing partial regions of the base layer 122. The second insulating layer 123b is formed on the first insulating layer 123a. The second insulating layer 123b has second openings H2 arranged in positions corresponding to the first openings H1. In this manner, the first and second insulating layers 123a and 123b may be provided as a single mask.

In the present embodiment, the second insulating layer 123b may be obtained by oxidizing the surface of the first insulating layer 123a. For example, in a case in which the first insulating layer 123a is SiN$_x$, the second insulating layer 123b may be an oxynitride such as SiON.

As illustrated in FIG. 28, the active layer 125b and the second conductivity-type semiconductor layer 125c may be formed at positions higher than the first insulating layer 123a. The second insulating layer 123b surrounds the active layer 125b and the second conductivity-type semiconductor layer 125c formed on the surfaces of the plurality of nanocores 125a, and the second opening H2 of the second insulating layer 123b may be defined along the perimeter of the light emitting nanostructure 125.

Meanwhile, a contact electrode 126 electrically connected to the second conductivity-type semiconductor layer 125c is formed on the surface of the second conductivity-type semiconductor layer 125c positioned to be higher than the second insulating layer 123b. With such a structure, a leakage current path between the contact electrode 126 and the nanocores 125a may be changed. Namely, in detail, a path d extending as long as the extended portion of the second conductivity-type semiconductor layer 125c (equal to the thickness of the second insulating layer 123b) which corresponds to the opening of the second insulating layer 123b and is not in direct contact with the contact electrode 126 and a thickness of the active layer 125b, is formed. Due to the lengthened path d, a probability of generating a leakage current may be significantly reduced.

In the case of the light emitting nanostructure employed in the present embodiment, a side surface thereof is illustrated as being perpendicular to the surface of the base layer, but the present disclosure is not limited thereto and the light emitting nanostructure may have a side surface having a predetermined tilt angle. The sloped side surface may be advantageous for extracting light from the light emitting nanostructure.

The light emitting nanostructure having the sloped side surface may be manufactured in various manners. For example, in a method using a mask as a mold structure, the mask having an opening with an appropriate sloped surface may be provided to provide a nanocore having a sloped side surface corresponding to the shape of the opening, and an active layer and a second conductivity-type semiconductor layer may be grown to have a predetermined thickness, thus finally providing a light emitting nanostructure having a desired sloped side surface.

A nanostructure semiconductor light emitting device manufactured according to the aforementioned exemplary embodiment may have electrode structures in various shapes. FIGS. 29 through 34 are cross-sectional views illustrating an example of an electrode formation process of the nanostructure semiconductor light emitting device.

Figure 29:
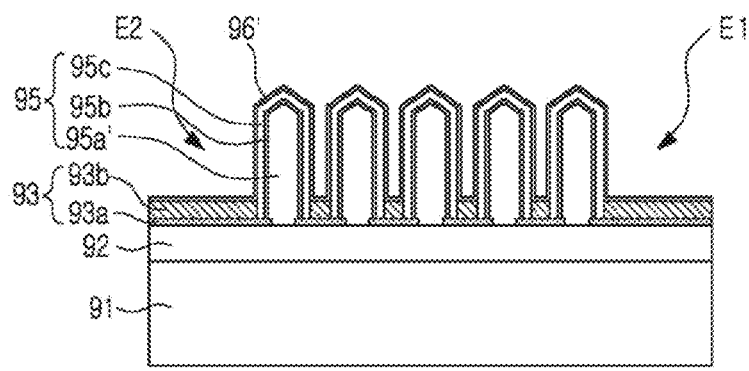
FIGS. 29 through 34 are cross-sectional views illustrating an example of an electrode formation process regarding the resultant product illustrated in FIG. 24.

As illustrated in FIG. 29, a contact electrode 96' may be formed on light emitting nanostructures 95.

The light emitting nanostructures 95 illustrated in FIG. 29 may be understood as being the same as that illustrated in FIG. 24, except that the light emitting nanostructures 95 are not formed in electrode formation regions E1 and E2.

The contact electrode 96' may be formed of a material forming ohmic-contact with the second conductivity-type semiconductor layer 95c. For example, the contact electrode 96' may include at least one of Ag, Ni, Al, Rh, Pd, Ir, Ru, Mg, Zn, Pt, and Au, and may be provided as a monolayer or a plurality of layers. In addition to these electrode materials, the contact electrode 96' may also be formed of a transparent electrode material such as ITO, and ZnO or graphene may also be used as necessary.

Figure 30:
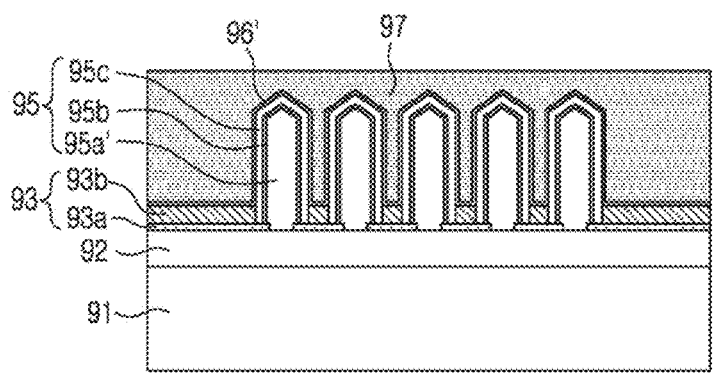

Subsequently, as illustrated in FIG. 30, a protective insulating layer 97 may be formed on the contact electrode 96'.

The protective insulating layer 97 may be formed of an electrically insulating material able to provide a passivation structure through a semiconductor process. A protective insulating layer formed of SiO$_2$ or SiN$_x$ may be used as the protective insulating layer 97. In detail, the protective insulating layer 97 may be formed of tetraethylorthosilane (TEOS), borophosphor silicate glass (BPSG), CVD-SiO$_2$, spin-on glass (SOG), or a spin-on dielectric (SOD) material in order to easily fill the spaces between the light emitting nanostructures 95.

Figure 31:
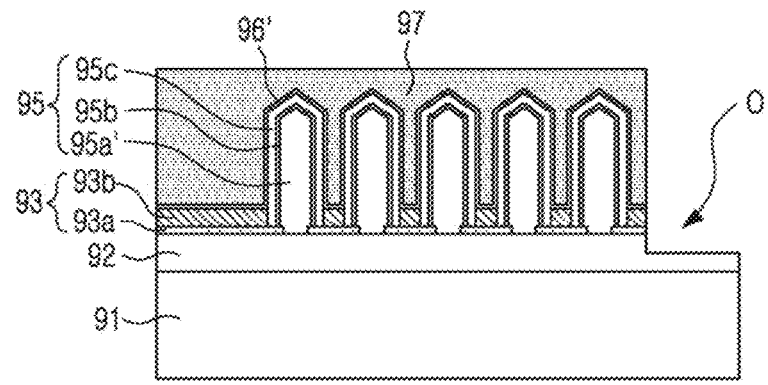

Subsequently, as illustrated in FIG. 31, the protective insulating layer 97 may be selectively removed to expose a portion O of the base layer 92.

The exposed region O of the base layer 92 may provide a region in which a first electrode is to be formed. The present removing process may be performed by an etching process using photolithography. In a case in which the light emitting nanostructure 95 is positioned in the region O to be etched, a process of removing the light emitting nanostructure 95 is required. However, like in the present exemplary embodiment, the nanocore 95a may not be grown in the region in which an electrode is to be formed, such that the light emitting nanostructure 95 to be removed during the present process is not present.

Figure 32:
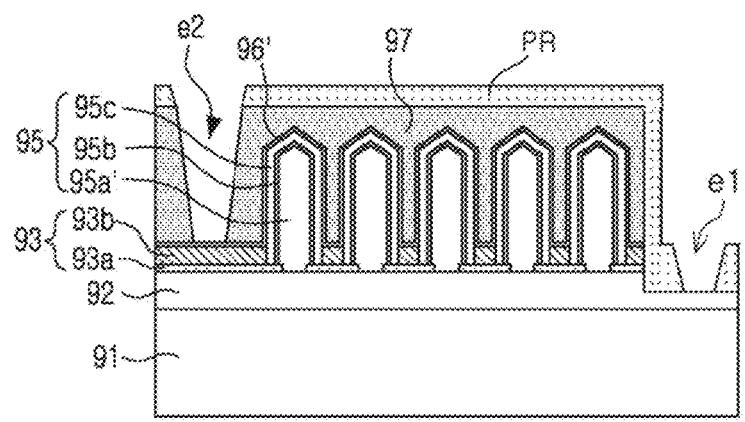

Thereafter, as illustrated in FIG. 32, photoresist PR having first and second openings e1 and e2 may be formed.

The first and second openings e1 and e2 may define first and second electrode formation regions. During the present process, the first opening e1 may expose a portion of the base layer 92 and the second opening e2 may expose a portion of the contact electrode 96'.

Figure 33:
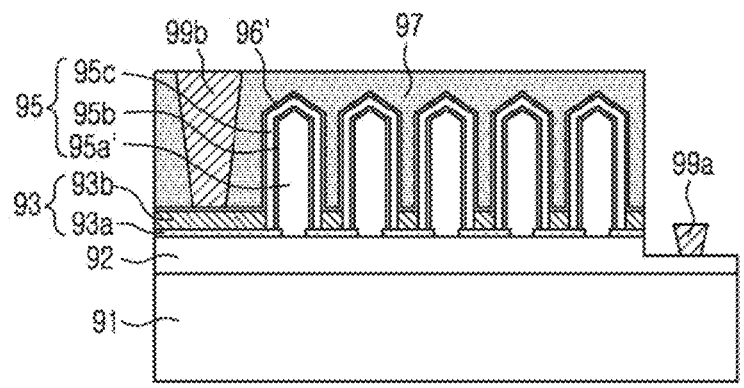

Thereafter, as shown in FIG. 33, first and second electrodes 99a and 99b are formed in the first and second openings e1 and e2, respectively. An electrode material used in the present process may be a common electrode material of the first and second electrodes 99a and 99b. For example, a material for the first and second electrodes 99a and 99b may include Au, Ag, Al, Ti, W, Cu, Sn, Ni, Pt, Cr, ZnO, ITO, graphene, Sn, TiW, AuSn, or eutectic metals thereof.

Subsequently, as illustrated in FIG. 34, an additional passivation layer 98 may be formed. The passivation layer 98 may be provided as a protective layer protecting the light emitting nanostructures 95 together with the protective insulating layer 97. The passivation layer 98 may firmly maintain the first and second electrodes 99a and 99b, as well as covering to protect the exposed semiconductor region. The passivation layer 98 may be formed of a material the same as or similar to that of the protective insulating layer 97.

FIGS. 35 through 38 are cross-sectional views illustrating sequential processes in obtaining nanocores using a mask of a specific example.

Figure 35:
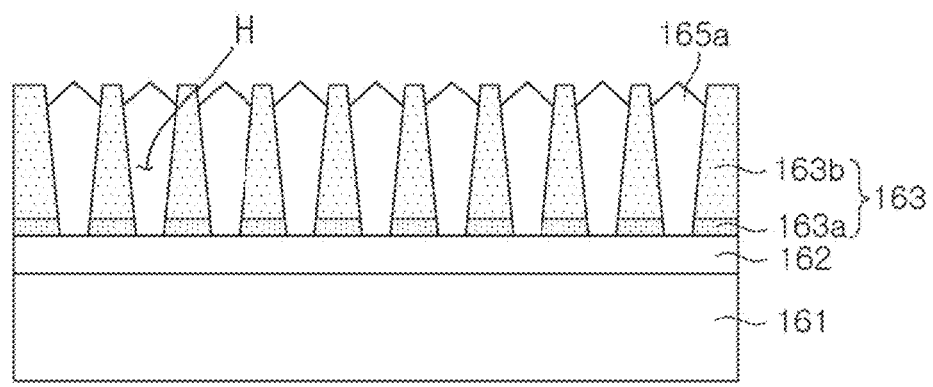
FIGS. 35 through 38 are cross-sectional views illustrating sequential processes in obtaining nanocores using a mask having a specific shape.

As illustrated in FIG. 35, nanocores 165a may be grown on a base layer 162 using the mask 163. The mask 163 has openings H having a width decreased toward a lower portion thereof. The nanocores 165*a* may be grown to have shapes corresponding to those of the openings H.

In order to further enhance crystal quality of the nanocores 165*a*, a heat treatment process may be performed one or more times during the growth of the nanocores 165*a*. In particular, a surface of an upper part of each nanocore 165*a* may be rearranged to have a hexagonal pyramidal crystal plane, thus obtaining a stable crystal structure and guaranteeing high quality in a crystal grown in a follow-up process.

The heat treatment process may be performed under the temperature conditions as described above. For example, for process convenience, the heat treatment process may be performed at a temperature equal or similar to the growth temperature of the nanocores 165*a*. Also, the heat treatment process may be performed in a manner of stopping a metal source such as TMGa, while maintaining pressure and a temperature equal or similar to the growth pressure and temperature of the nanocores 165*a*. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process introduced during the growth process of the nanocores 165*a* may prevent degeneration of crystallinity caused when the nanocores 165*a* are grown at a fast speed, and thus, rapid crystal growth and excellent crystal quality may be promoted.

A time of a heat treatment process section and the number of heat treatment processes for stabilization may be variously modified according to a height and diameter of final nanocores. For example, in a case in which a width of each opening ranges from 300 nm to 400 nm and a height of each opening (thickness of the mask) is approximately 2.0 μm, a stabilization time duration ranging from approximately 10 seconds to 60 seconds may be inserted in a middle point, i.e., approximately 1.0 μm to grow cores having desired high quality. The stabilization process may be omitted according to core growth conditions.

Figure 36:
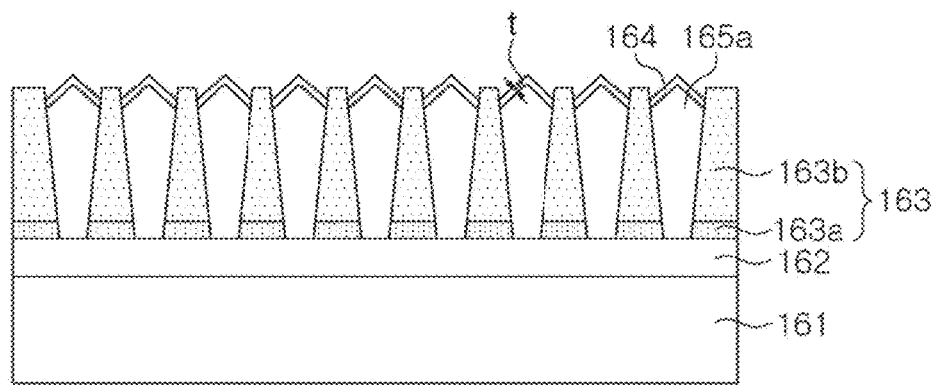

Subsequently, as illustrated in FIG. 36, a current suppressing intermediate layer 164, a highly resistive layer, may be formed on the upper part of the nanocores 165*a*.

After the nanocores 165*a* are formed to have a desired height, the current suppressing intermediate layer 164 may be formed on the surfaces of the upper parts of the nanocores 165*a* with the mask 163 retained as is. Thus, since the mask 163 is used as is, the current suppressing intermediate layer 164 may be easily formed in the desired regions (the surface of the upper parts) of the nanocores 165*a* without a process of forming an additional mask.

The current suppressing intermediate layer 164 may be a semiconductor layer not doped on purpose or may be a semiconductor layer doped with a second conductivity-type impurity opposite to that of the nanocores 165*a*. For example, in a case in which the nanocores 165*a* are n-type GaN, the current suppressing intermediate layer 164 may be undoped GaN or GaN doped with magnesium (Mg) as a p-type impurity. In this case, by changing types of an impurity during the same growth process, the nanocores 165*a* and the current suppressing intermediate layer 164 may be continuously formed. For example, in case of stopping silicon (Si) doping and injecting magnesium (Mg) and growing the same for approximately 1 minute under the same conditions as those of the growth of the n-type GaN nanocores, the current suppressing intermediate layer 164 having a thickness ranging from approximately 200 nm to 300 nm may be formed, and such a current suppressing intermediate layer 164 may effectively block a leakage current of a few μA or more. In this manner, the current suppressing intermediate layer may be simply formed during the mold-type process as in the present embodiment.

Figure 37:
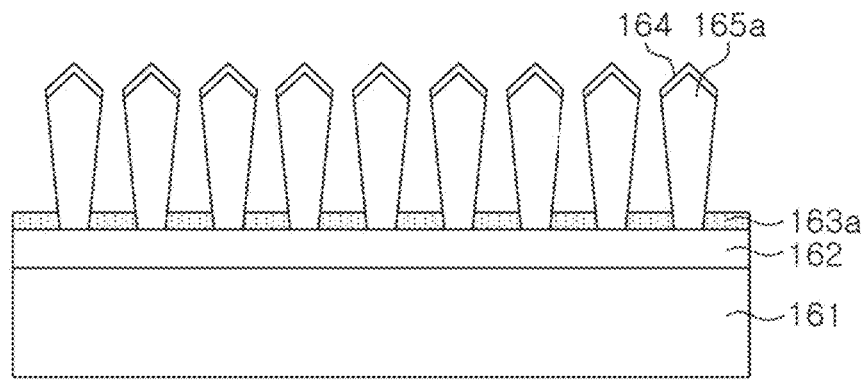

Subsequently, as illustrated in FIG. 37, portions of the mask layer 163 to reach the first material layer 163*a* as an etch-stop layer are removed to expose side surfaces of the plurality of nanocores 165*a*.

In the present embodiment, by applying the etching process of selectively removing the second material layer 163*b*, only the second material layer 163*b* may be removed, while the first material layer 163*a* may be retained. The residual first material layer 163*a* may serve to prevent the active layer and the second conductivity-type semiconductor layer from being connected to the base layer 162 in a follow-up growth process.

In the present embodiment, an additional heat treatment process may be introduced during the process of forming the light emitting nanostructures using the mask having openings as a mold in order to enhance crystallinity.

Figure 38:
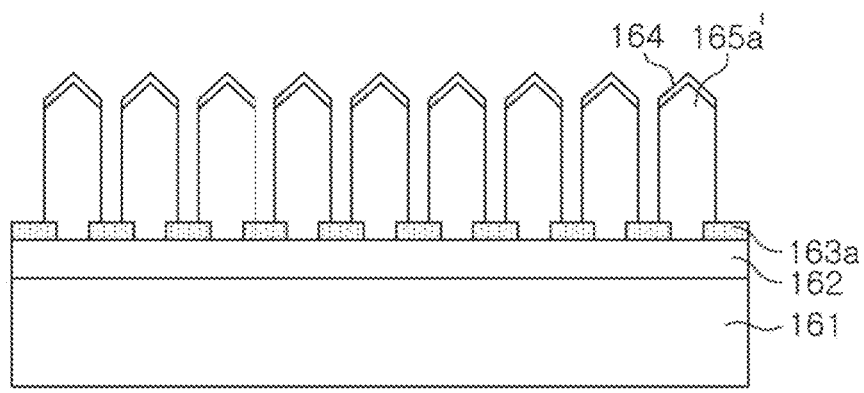

After the second material layer 163*b* of the mask 163 is removed, the surfaces of the nanocores 165*a* may be heat-treated under predetermined conditions to change unstable crystal planes of the nanocores 165*a* into stable crystal planes (please refer to FIGS. 26 and 27). In particular, in the present embodiment, the nanocores 165*a* are grown on the openings having sloped side walls to have the sloped side walls corresponding to the shape of the openings. However, after the heat treatment process is performed, crystals are rearranged and regrown so the nanocores 165*a*' may have a substantially uniform diameter (or width) as illustrated in FIG. 38. Also, the upper parts of the nanocores 165*a* may have an incomplete hexagonal pyramidal shape immediately after being grown, but the nanocores 165*a*' after the heat treatment process may have a hexagonal pyramidal shape having uniform surfaces. In this manner, the nanocores having a non-uniform width after the removal of the mask may be regrown (and rearranged) to have a hexagonal pyramidal columnar structure having a uniform width through the heat treatment process.

Hereinafter, the results of the regrowth (rearrangement) of the nanocores based on the heat treatment process as described above will be described through specific Experimental Example.

Experimental Example (Heat Treatment Process)

Figure 39:
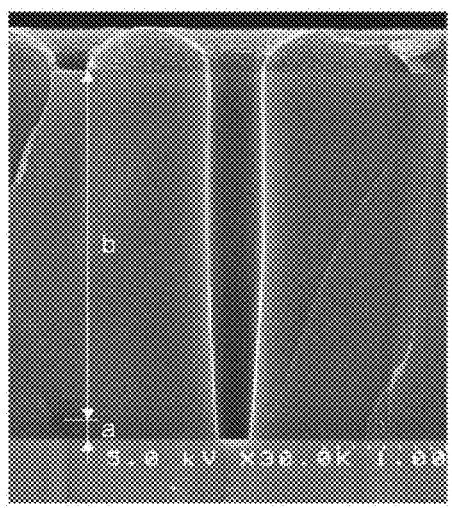
FIG. 39 is a scanning electron microscope (SEM) photograph obtained by imaging a mask employed in an experimental example.

Two layers ("a" and "b" of FIG. 39) of $SiN/SiO_2$ were formed on an n-type GaN base layer and openings were formed. Here, the SiN layer was formed to have a thickness of approximately 100 nm and the $SiO_2$ layer was formed to have a thickness of 2500 nm. Openings of the mask were formed by performing etching with a plasma obtained by combining $C_4F_8$, $O_2$ and, Ar for approximately 5 minutes through a photoresist process. FIG. 39 is a scanning electron microscope (SEM) photograph obtained by imaging a cross-section of an opening obtained through the process. As illustrated in FIG. 39, the opening in the mask has a width decreased toward a lower portion thereof.

Nanocores were grown on the openings of the mask using an MOCVD process. Here, TMGa and $NH_3$ were used as source gases, and nanocores were grown for approximately minutes, while the temperature of a substrate was maintained at approximately 1100° C.

In order to enhance crystal quality of the nanocores, a stabilization process (heat treatment process) was additionally performed during the growth of the nanocores. Namely, when the nanocores 35*a* were grown to reach a height of approximately 1.0 μm, a desired intermediate point (approximately 10 minutes) of the nanocores, supply of a TMGa source was stopped and a heat treatment was performed at a temperature (approximately 1100° C.) similar to that of the substrate during the growth for approximately 30 seconds to 50 seconds under an $NH_3$ atmosphere. Subsequently, nanocores were re-grown under the conditions similar to the growth conditions before a heat treatment process.

Figure 40A:
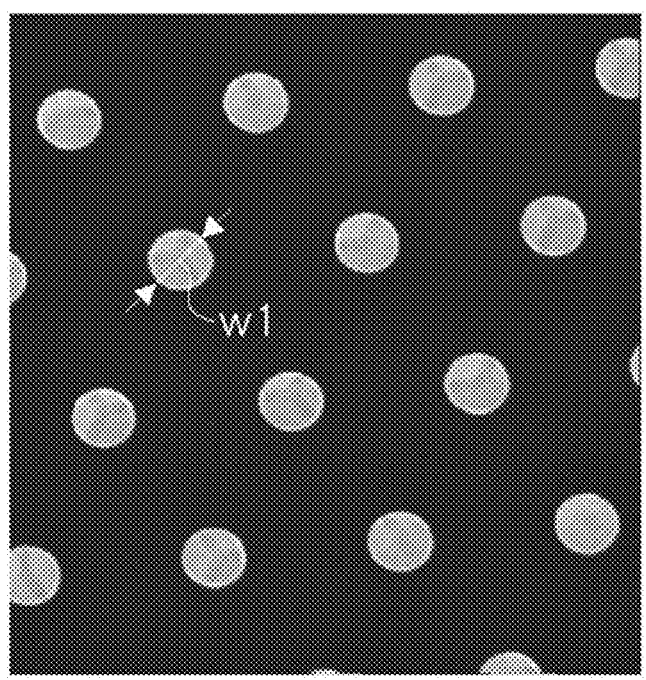
FIG. 40 is SEM photographs obtained by imaging a planar arrangement of nanocores and a lateral cross-sectional structure grown using a mask employed in an experimental example.
Figure 40B:
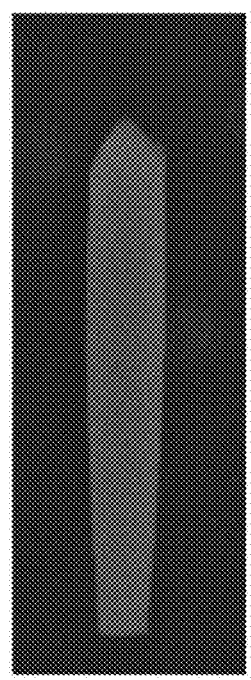

After the growth of the desired nanocores was completed, a $SiO_2$ portion ("b" of FIG. 39) of the mask was removed. The nanocores corresponding to the shape of the openings appeared to have a cylindrical shape having sloped side walls (please refer to FIGS. 40(a) and 40(b)). The nanocores having the cylindrical structure were determined to have a height of approximately 2467 nm and a diameter of approximately 350 nm.

After the mask was removed, a heat treatment process was applied. Namely, the heat treatment process was performed at a substrate temperature of approximately 1100° C. (1000° C. to 1200° C.) for approximately 20 minutes (15 minutes to 25 minutes).

Figure 41A:
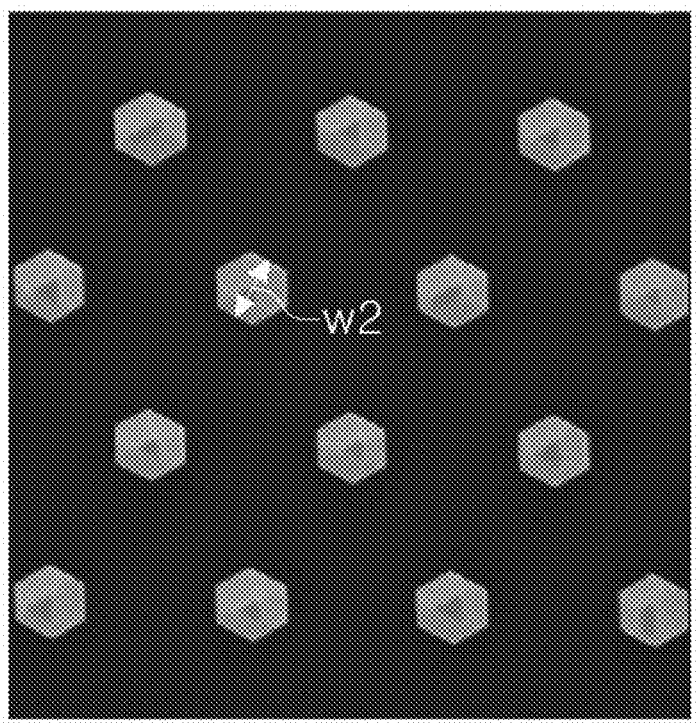
FIG. 41 is SEM photographs obtained by imaging a planar arrangement of nanocores and a lateral cross-sectional structure heat-treated in an experimental example.
Figure 41B:
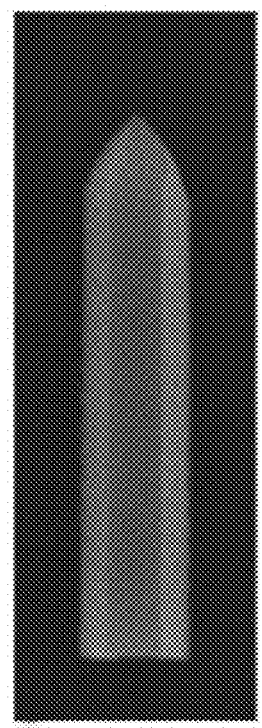

After the heat treatment process, crystals of the nanocores were regrown and rearranged, and it was confirmed that the diameter which was not uniform in the height direction was changed into a substantially uniform diameter and the incomplete hexagonal pyramidal shape of the upper parts of the nanocores was changed into a hexagonal pyramidal shape having uniform surfaces after the heat treatment process (please refer to FIGS. 41(a) and 41(b)).

In detail, a diameter w1 of each nanocore before the heat treatment process was 350 nm, but after the heat treatment process, the width (w2: interfacial interval of the hexagon) was approximately 410 nm, approximately 60 nm or greater. Also, it was confirmed that, while a degree of increase is smaller, a height of each nanocore was changed from 2467 nm to 2470 nm, exhibiting an increase of approximately 3 nm.

As in the Experimental Example, it was confirmed that the nanocores having an uneven width after the removal of the mask was regrown (and rearranged) to have the hexagonal pyramidal columnar structure having a uniform width through the heat treatment process.

During the foregoing heat treatment process, a size and a shape of the nanocores after the regrowth may be relatively changed depending on a heat treatment process temperature (namely, a substrate temperature) and a heat treatment process time, whether or not a source gas is supplied, or an amount of supplied source gas. For example, heat treatment may be performed at a temperature of 1000° C. or higher for 5 or more minutes in a state in which supply of a source gas is stopped, crystals may be rearranged on the surface of the nanocores, reducing a change in size of nanocores due to an etching effect (namely, N evaporation). The change in the diameter of the nanocores may be maintained at a level of 50% or less in consideration of a process time, condition, and cost. As described above, uniformity of the diameter (or width) of the nanocores may be maintained at 95% or more. In this case, the diameter of each nanocore grown in a group in which sizes of openings of the mask are equal may be substantially equal.

The nanostructure semiconductor light emitting device according to the exemplary embodiment as described above may be implemented to various packages.

Figure 42:
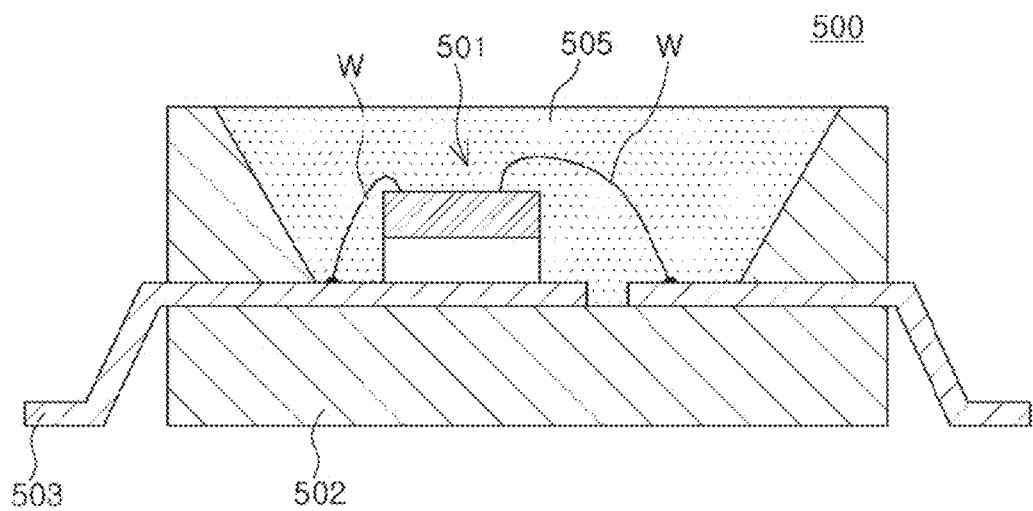
FIGS. 42 and 43 are views illustrating various examples of a semiconductor light emitting device package employing a semiconductor light emitting device according to an exemplary embodiment of the present inventive concept.
Figure 43:
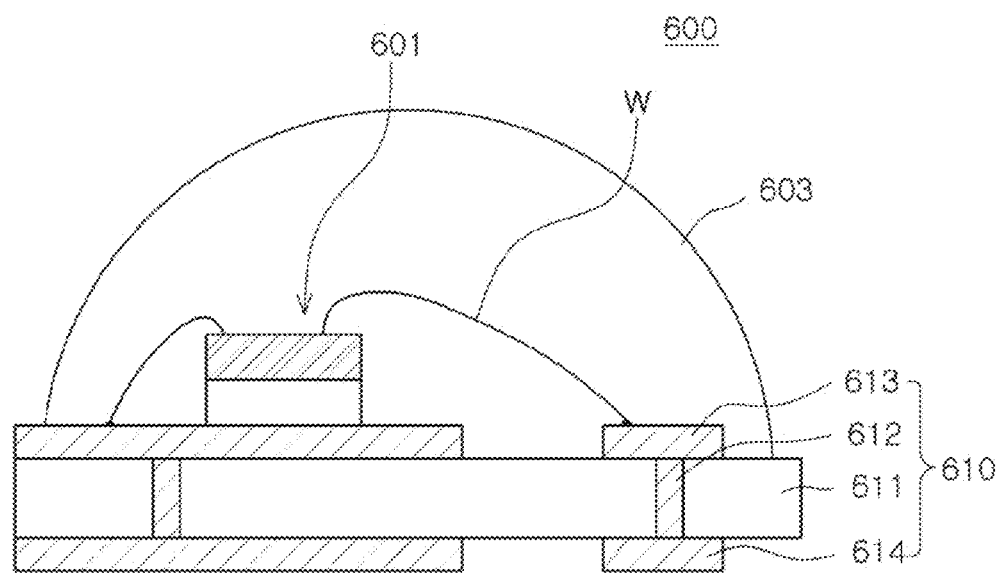

FIGS. 42 and 43 are views illustrating examples of a package employing the foregoing semiconductor light emitting device.

A semiconductor light emitting device package 500 illustrated in FIG. 42 may include a semiconductor light emitting device 501, a package body 502, and a pair of lead frames 503.

The semiconductor light emitting device 501 may be the aforementioned nanostructure semiconductor light emitting device. The semiconductor light emitting device 501 may be mounted on the lead frames 503 and electrically connected to the lead frames 503 through wires W.

If necessary, the semiconductor light emitting device 501 may be mounted on a different region, for example, on the package body 502, rather than on the lead frames 503. Also, the package body 502 may have a cup shape to improve reflectivity efficiency of light. An encapsulant 505 formed of a light-transmissive material may be formed in the reflective cup to encapsulate the semiconductor light emitting device 501, the wire W, and the like.

A semiconductor light emitting device package 600 illustrated in FIG. 43 may include a semiconductor light emitting device 601, a mounting board 610, and an encapsulant 603.

A wavelength conversion unit 602 may be formed on a surface and a side surface of the semiconductor light emitting device 601. The semiconductor light emitting device 601 may be mounted on the mounting board 610 and electrically connected to the mounting board 610 through a wire W.

The mounting board 610 may include an upper electrode 61, a lower electrode 614, and a through electrode 612 connecting the upper electrode 613 and the lower electrode 614. The mounting board 610 may be provided as a board such as PCB, MCPCB, MPCB, FPCB, or the like, and the structure of the mounting board 610 may be applied to have various forms.

The wavelength conversion unit 602 may include a phosphor, a quantum dot, or the like. The encapsulant 603 may be formed to have a lens structure with an upper surface having a convex dome shape. However, according to an exemplary embodiment, the encapsulant 603 may have a lens structure having a convex or concave surface to adjust a beam angle of light emitted through an upper surface of the encapsulant 603.

The nanostructure semiconductor light emitting device and a package having the same according to the exemplary embodiment as described above may be advantageously applied to various application products.

Figure 44:
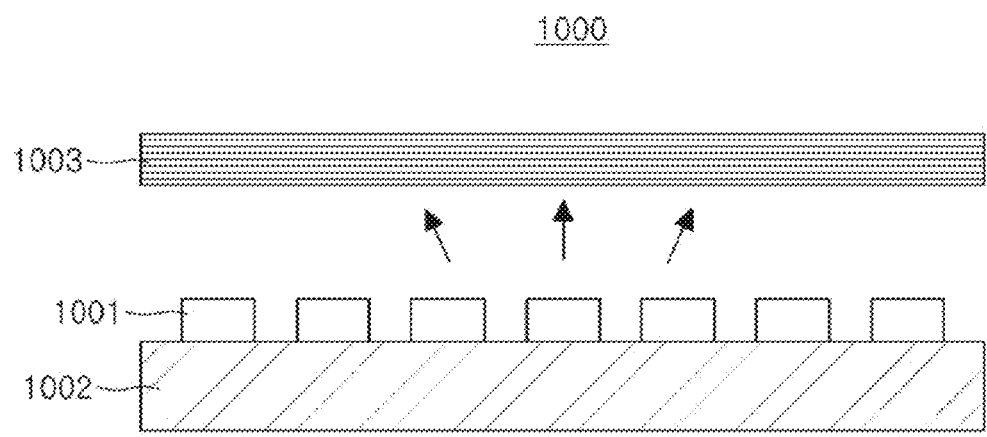
FIGS. 44 and 45 are views illustrating a backlight unit employing a semiconductor light emitting device according to an exemplary embodiment of the present inventive concept.
Figure 45:
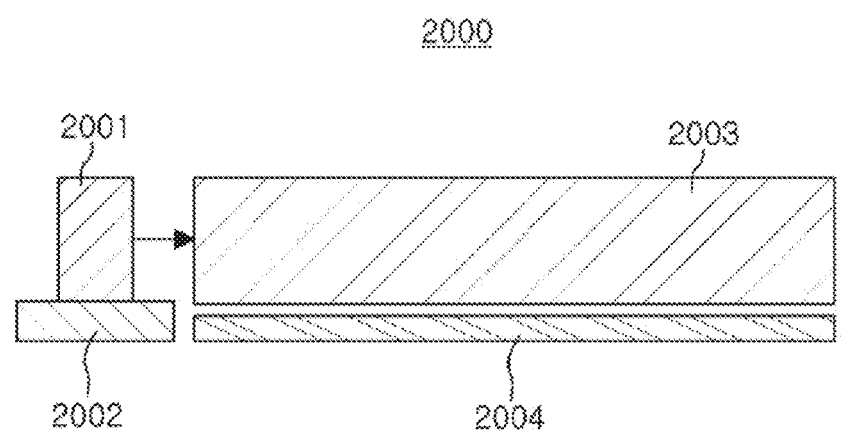

FIGS. 44 and 45 are views illustrating a backlight unit employing a semiconductor light emitting device according to an exemplary embodiment of the present inventive concept.

Referring to FIG. 44, a backlight unit 1000 includes light sources 1001 mounted on a substrate 1002 and one or more optical sheets 1003 disposed above the light sources 1001. The aforementioned semiconductor light emitting device or a package employing the semiconductor light emitting device may be used as the light sources 1001.

Unlike the backlight unit 1000 in FIG. 44 in which the light sources 1001 emit light toward an upper side on which a liquid crystal display is disposed, a backlight unit 2000 as another example illustrated in FIG. 45 is configured such that light sources 2001 mounted on a board 2002 emit light in a lateral direction, and the emitted light may be incident to a light guide plate 2003 so as to be converted into a surface light source. Light, passing through the light guide plate 2003, is emitted upwardly, and in order to enhance light extraction efficiency, a reflective layer 2004 may be disposed on a lower surface of the light guide plate 2003.

Figure 46:
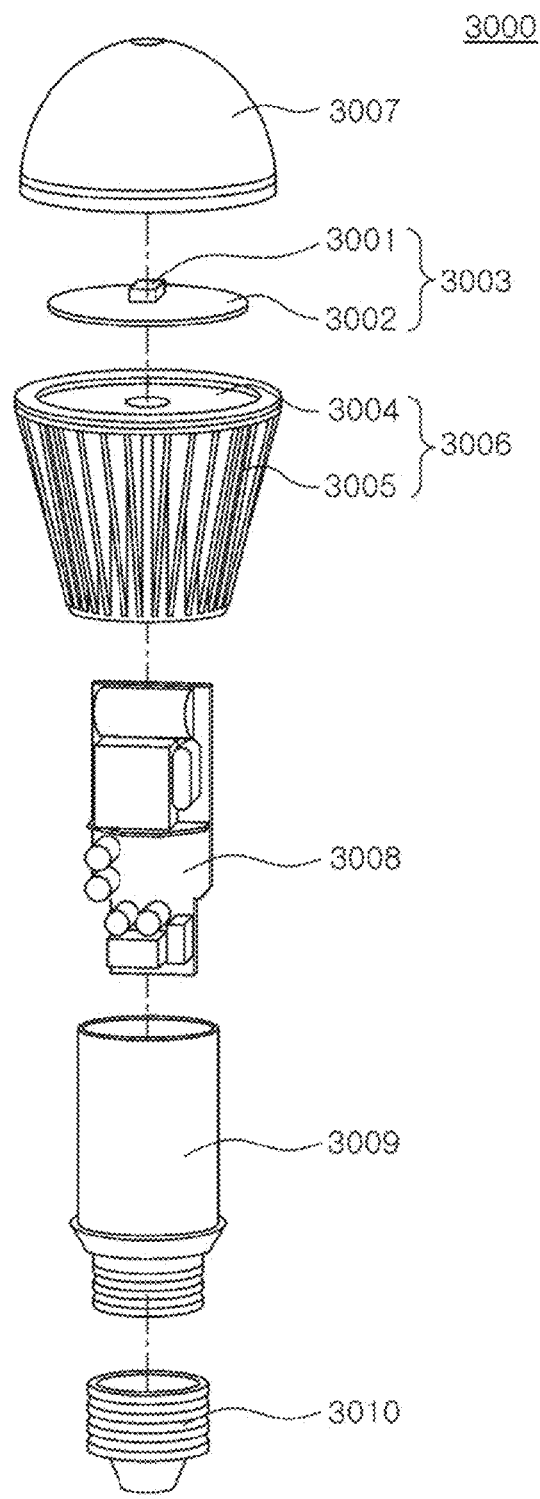
FIG. 46 is a view illustrating an example of a lighting device employing a semiconductor light emitting device according to an exemplary embodiment of the present inventive concept.

FIG. 46 is a view illustrating an example of a lighting device employing a semiconductor light emitting device according to an exemplary embodiment of the present inventive concept.

A lighting device 3000 is illustrated, for example, as a bulb-type lamp in FIG. 46, and includes a light emitting module 3003, a driving unit 3008, and an external connection unit 3010.

Also, the lighting device 3000 may further include external structures such as external and internal housings 3006 and 3009 and a cover unit 3007. The light emitting module 3003 may include a light source 3001 having the aforementioned semiconductor light emitting device package structure or a structure similar thereto and a circuit board 3002 with the light source 3001 mounted thereon. For example, the first and second electrodes of the aforementioned semiconductor light emitting device may be electrically connected to an electrode pattern of the circuit board 3002. In the present embodiment, it is illustrated that a single light source 3001 is mounted on the circuit board 3002, but a plurality of light sources may also be mounted as needed.

The external housing 3006 may serve as a heat dissipation unit and may include a heat dissipation plate 3004 disposed to be in direct contact with the light emitting module 3003 to enhance heat dissipation and heat dissipation fins 3005 surrounding the side surfaces of the lighting device 3000. Also, the cover unit 3007 may be installed on the light emitting module 3003 and have a convex lens shape. The driving unit 3008 is installed in the internal housing 3009 and connected to the external connection unit 3010 having a socket structure to receive power from an external power source. Also, the driving unit 3008 may serve to convert power into an appropriate current source for driving the semiconductor light emitting device 3001 of the light emitting module 3003, and provide the same. For example, the driving unit 3008 may be configured as an AC-DC converter or a rectifying circuit component.

Figure 47:
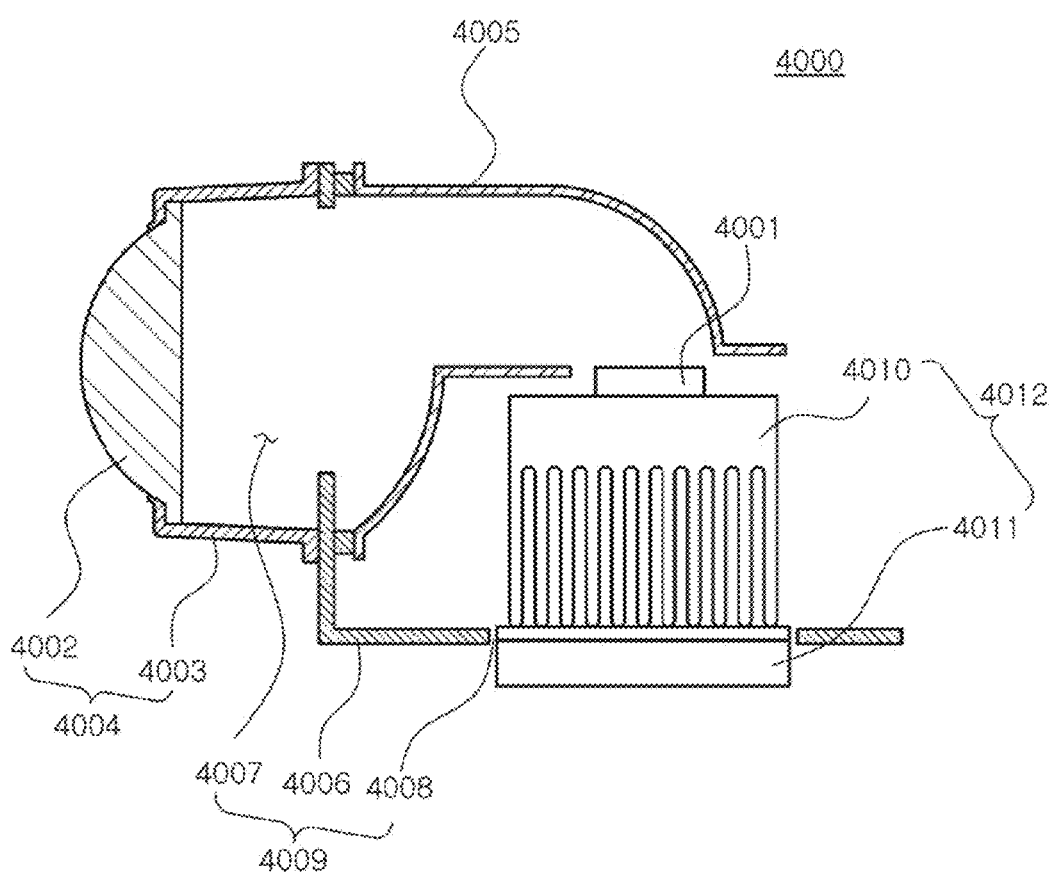
FIG. 47 is a view illustrating an example of a headlamp employing a semiconductor light emitting device according to an exemplary embodiment of the present inventive concept.

FIG. 47 is a view illustrating an example of a headlamp employing a semiconductor light emitting device according to an exemplary embodiment of the present inventive concept.

Referring to FIG. 47, a headlamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include the aforementioned semiconductor light emitting device or a package including the semiconductor light emitting device.

The headlamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the headlamp 4000 may further include a housing 4009 fixedly supporting the heat dissipation unit 4012 and the reflective unit 4005, and the housing 4009 may have a central hole 4008 formed in one surface thereof, in which the heat dissipation unit 4012 is coupled.

The housing 4009 may have a front hole 4007 formed in the other surface integrally connected to the one surface and bent in a right angle direction. The front hole 4007 may allow the reflective unit 4005 to be fixedly positioned above the light source 4001. Accordingly, a front side is open by the reflective unit 4005, and the reflective unit 4005 is fixed to the housing 4009 such that the open front side corresponds to the front hole 4007, and light reflected by the reflective unit 4005 may pass through the front hole 4007 so as to be output outwardly.

While the present inventive concept has been shown and described in connection with the embodiments, it will be apparent to those skilled in the art that modifications and variations may be made without departing from the spirit and scope of the invention as defined by the appended claims.

The invention claimed is:

1. A nanostructure semiconductor light emitting device comprising:
   a base layer formed of a first conductivity-type semiconductor;
   a first insulating layer disposed on the base layer and having a plurality of first openings exposing partial regions of the base layer;
   a plurality of nano-light emitting structures, each comprising a nanocore disposed in the exposed regions of the base layer and formed of the first conductivity-type semiconductor and a shell including an active layer and a second conductivity-type semiconductor layer sequentially disposed on a surface of the nanocore; and;
   a second insulating layer disposed on the first insulating layer and having a plurality of second openings surrounding the nanocore and the active layer,
   wherein the first openings have first inner side walls, each of the first inner side walls contacting the nanocore, and the second openings have second inner side walls, each of the second inner side walls directly contacting the active layer.

2. The nanostructure semiconductor light emitting device of claim 1, wherein the second openings have a diameter greater than that of the first openings, and
   a portion of the first insulating layer in the perimeter of the first openings is exposed by the second openings.

3. The nanostructure semiconductor light emitting device of claim 2, wherein regions of the nanocores positioned in the second openings have a sectional area greater than upper and lower regions thereof.

4. The nanostructure semiconductor light emitting device of claim 1, wherein the inner side walls of the second openings have an upwardly sloped surface, and
   an end of the active layer is positioned on the sloped surface.

5. The nanostructure semiconductor light emitting device of claim 1, wherein the first and second insulating layers are formed of the same material.

6. The nanostructure semiconductor light emitting device of claim 1, wherein the first and second insulating layers have different etching rates under the same etching conditions.

7. The nanostructure semiconductor light emitting device of claim 6, wherein an etching rate of the second insulating layer is higher than that of the first insulating layer.

8. The nanostructure semiconductor light emitting device of claim 6, wherein the first and second insulating layers are formed of different materials or are disposed to have different air gap densities.

9. The nanostructure semiconductor light emitting device of claim 1, wherein the second insulating layer is formed of a material obtained by oxidizing a material of the first insulating layer.

10. The nanostructure semiconductor light emitting device of claim 1, wherein the second conductivity-type semiconductor layer is disposed on the second insulating layer so that an entirety of the second conductivity-type semiconductor layer is positioned above the second insulating layer.

11. The nanostructure semiconductor light emitting device of claim 1, further comprising a current suppressing intermediate layer disposed on a tip portion of the nanocore between the nanocore and the active layer.

12. The nanostructure semiconductor light emitting device of claim 11, wherein the current suppressing intermediate layer comprises an undoped semiconductor or a second conductivity-type semiconductor.

13. The nanostructure semiconductor light emitting device of claim 11, wherein the nanocore has a main portion and the tip portion disposed on the main portion, and the main portion provides a lateral surface having a first crystal face and the tip portion provides a surface having a second crystal face different from the first crystal face.

14. The nanostructure semiconductor light emitting device of claim 11, wherein the main portion has a hexagonal prism shape and the tip portion has a hexagonal pyramidal shape.

* * * * *